(12) United States Patent
Aoki

(10) Patent No.: US 10,432,124 B2
(45) Date of Patent: Oct. 1, 2019

(54) CURRENT DETECTION APPARATUS AND CONTROL APPARATUS OF ROTARY ELECTRIC MACHINE

(71) Applicant: DENSO CORPORATION, Kariya, Aichi-pref. (JP)

(72) Inventor: Yasuaki Aoki, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/170,533

(22) Filed: Oct. 25, 2018

(65) Prior Publication Data
US 2019/0131904 A1 May 2, 2019

(30) Foreign Application Priority Data
Oct. 26, 2017 (JP) ................. 2017-207645

(51) Int. Cl.
| | |
|---|---|
| H02P 21/00 | (2016.01) |
| H02P 21/22 | (2016.01) |
| H02P 21/16 | (2016.01) |
| G01R 19/04 | (2006.01) |
| H02M 1/08 | (2006.01) |
| H02M 7/5387 | (2007.01) |
| H02P 27/12 | (2006.01) |
| H02P 27/08 | (2006.01) |

(Continued)

(52) U.S. Cl.
CPC .............. *H02P 21/22* (2016.02); *G01R 19/04* (2013.01); *H02M 1/08* (2013.01); *H02M 7/53871* (2013.01); *H02P 21/16* (2016.02); *H02P 27/08* (2013.01); *H02P 27/12* (2013.01); *H02M 7/5395* (2013.01); *H02M 2001/0009* (2013.01)

(58) Field of Classification Search
CPC .......... H02P 21/22; H02P 27/12; H02P 21/16; H02M 1/08; H02M 7/53871; H02M 2001/0009; G01R 19/04
USPC ................................................... 318/400.02
See application file for complete search history.

(56) References Cited

U.S. PATENT DOCUMENTS

2015/0171070 A1 6/2015 Hanaoka
2015/0333681 A1* 11/2015 Matsuki .................. H02P 21/06
318/400.02

(Continued)

FOREIGN PATENT DOCUMENTS

JP 2003-164159 A 6/2003
JP 2004-064903 A 2/2004

*Primary Examiner* — Eduardo Colon Santana
*Assistant Examiner* — Gabriel Agared
(74) *Attorney, Agent, or Firm* — Oliff PLC

(57) ABSTRACT

In a current detection apparatus, a corrector obtains first current-value pairs of the plural values of the corrective first phase current and the respective plural values of the corrective first phase bus-based current synchronized with the plural values of the corrective first phase current. The corrector obtains second current-value pairs of the plural values of the corrective second phase current and the respective plural values of the corrective second phase bus-based current synchronized with the plural pairs of the corrective second phase current. The corrector corrects at least target first and second phase currents detected by a first current detector based on the obtained first current-value pairs and the second current-value pairs to thereby align amplitudes of the respective target first and second phase currents with each other.

14 Claims, 24 Drawing Sheets

(51) Int. Cl.
*H02M 1/00* (2006.01)
*H02M 7/5395* (2006.01)

(56) References Cited

U.S. PATENT DOCUMENTS

2016/0028340 A1* 1/2016 Nakai .................... H02P 21/05
                                                        318/400.02
2017/0201201 A1* 7/2017 Aoki ...................... H02P 21/22
2017/0338764 A1* 11/2017 Irie ........................ B60L 3/003
2018/0167004 A1* 6/2018 Suzuki .................. H02P 21/05

* cited by examiner

FIG.2

| VOLTAGE VECTOR | SWITCH BEING ON | | | 1 SHUNT (IDC) | ARM CURRENT |
|---|---|---|---|---|---|
| V0 | Sun | Svn | Swn | UNDETECTABLE | −Iu, −Iv, −Iw |
| V1 | Sup | Svn | Swn | Iu | −Iv, −Iw |
| V2 | Sup | Svp | Swn | −Iw | −Iw |
| V3 | Sun | Svp | Swn | Iv | −Iu, −Iw |
| V4 | Sun | Svp | Swp | −Iu | −Iu |
| V5 | Sun | Svn | Swp | Iw | −Iu, −Iv |
| V6 | Sup | Svn | Swp | −Iv | −Iv |
| V7 | Sup | Svp | Swp | UNDETECTABLE | UNDETECTABLE |

<THREE PHASE DETECTION>

UNCORRECTED

CORRECTED

EFFECT DUE TO RINGING

FIG.19

| VOLTAGE VECTOR | SWITCH BEING ON | | | 1 SHUNT (IDC) | ARM CURRENT |
|---|---|---|---|---|---|
| V0 | Sun | Svn | Swn | UNDETECTABLE | UNDETECTABLE |
| V1 | Sup | Svn | Swn | Iu | Iu |
| V2 | Sup | Svp | Swn | -Iw | Iu, Iv |
| V3 | Sun | Svp | Swn | Iv | Iv |
| V4 | Sun | Svp | Swp | -Iu | Iv, Iw |
| V5 | Sun | Svn | Swp | Iw | Iw |
| V6 | Sup | Svn | Swp | -Iv | Iu, Iw |
| V7 | Sup | Svp | Swp | UNDETECTABLE | Iu, Iv, Iw |

CURRENT DETECTION APPARATUS AND CONTROL APPARATUS OF ROTARY ELECTRIC MACHINE

CROSS REFERENCE TO RELATED APPLICATIONS

This application is based on and claims the benefit of priority from Japanese Patent Application 2017-207645 filed on Oct. 26, 2017, the disclosure of which is incorporated in its entirety herein by reference.

TECHNICAL FIELD

The present disclosure relates to current detection apparatuses applicable to power systems, and control apparatuses each including such a current detection apparatus.

BACKGROUND

An example of such current detection apparatuses, which is disclosed in Japanese Patent Application Publication No. 2017-123736, is applied for a system including an inverter and a rotary electric machine connected to the inverter; the plural pairs of upper- and lower-arm switches correspond to the respective phases of the rotary electric machine.

Specifically, the current detection apparatus, which will be referred to as a conventional current detection apparatus, includes an arm current detector, a bus current detector, and an amplitude correction unit.

The arm current detector detects a peak of each of at least first and second phase currents having respective amplitudes and flowing in the multiphase rotary electric machine based on a potential difference between input and output terminals of the corresponding one of the first and second detection switches while the corresponding one of the first and second detection switches is on.

The bus current detector is configured to detect a peak of a bus current flowing through a bus of the inverter as a bus-based peak for each of the first and second phase currents.

The amplitude correction unit is configured to correct each of the first and second phase currents detected by the arm current detector to thereby match the peak of each of the first and second currents detected by the arm current detector with the bus-based peak for the corresponding one of the first and second phase currents. This results in the amplitudes of the respective first and second phase currents being the same as each other.

SUMMARY

The conventional current detection apparatus may result in a peak detection timing by the bus current detector being deviated from a peak detection timing by the arm current detector. This may result in a possibility of deterioration in the correction accuracy of the first and second phase currents. For example, the peak detection timing deviation may cause ripples included in each of the first and second phase currents at the peak detection timing by the bus current detector to be different from ripples included in the corresponding one of the first and second phase currents at the peak detection timing by the arm current detector. This may result in a possibility of deterioration in the correction accuracy of the first and second phase currents.

In view of the circumstances set forth above, a first aspect of the present disclosure seeks to provide current detection apparatuses, each of which is capable of having higher correction accuracy of phase currents, and control apparatuses for controlling a rotary electric machine; each of the control apparatuses includes such a current detection apparatus.

According to a first exemplary aspect of the present disclosure, there is provided a current detection apparatus applicable to a system. The system includes an inverter including plural pairs of series-connected upper-arm switches and lower-arm switches, and a multi-phase rotary electric machine including multiphase windings. The upper- and lower-arm switches of each pair are connected to a respective phase winding of the multi-phase rotary electric machine. An upper set of the upper-arm switches is connected to a direct-current power supply via a first bus, and a lower set of the lower-arm switches is connected to the direct-current power supply via a second bus.

The current detection apparatus includes a first current detector configured to repeatedly detect at least a corrective first phase current flowing through a corresponding first phase winding of the multiphase windings to thereby obtain plural values of the corrective first phase current, and a corrective second phase current flowing through a corresponding second phase winding of the multiphase windings to thereby obtain plural values of the corrective second phase current.

The current detection apparatus also includes a second current detector configured to repeatedly detect at least (1) A corrective first phase bus-based current flowing through one of the first and second buses to thereby obtain plural values of the corrective first phase bus-based current, the corrective first phase bus-based current having the same phase as the phase of the corrective first phase current, the plural values of the corrective first phase bus-based current being synchronized with the respective plural values of the corrective first phase current (2) A corrective second phase bus-based current flowing through one of the first and second buses to thereby obtain plural values of the corrective second phase bus-based current, the corrective second phase bus-based current having the same phase as the phase of the corrective second phase current, the plural values of the corrective second phase bus-based current being synchronized with the respective plural values of the corrective second phase current The current detection apparatus includes a corrector configured to obtain first current-value pairs of the plural values of the corrective first phase current and the respective plural values of the corrective first phase bus-based current, and second current-value pairs of the plural values of the corrective second phase current and the respective plural values of the corrective second phase bus-based current. The corrector is configured to correct at least target first and second phase currents detected by the first current detector based on the obtained first current-value pairs and the second current-value pairs to thereby align amplitudes of the respective target first and second phase currents detected by the first current detector with each other.

According to a second exemplary aspect of the present disclosure, there is provided a control apparatus for controlling a controlled variable of a multiphase rotary electric machine including multiphase windings. The multiphase rotary electric machine is connected to an inverter including plural pairs of series-connected upper-arm switches and lower-arm switches. The upper- and lower-arm switches of each pair is connected to a corresponding one phase winding of the multi-phase rotary electric machine, and an upper set of the upper-arm switches is connected to a direct-current power supply via a first bus. A lower set of the lower-arm switches is connected to the direct-current power supply via a second bus. The control apparatus includes a rotation detection apparatus according to the first exemplary aspect of the present disclosure, and a switch controller configured to control on-off switching operations of the upper-arm and lower-arm switches of each pair in accordance with command voltages for the respective multiphase windings, thus adjusting a value of the controlled variable of the multiphase rotary electric machine to a commanded value.

The current detection apparatus according to each of the first and second exemplary aspects is configured such that (1) The corrective first phase bus-based current flowing through one of the first and second buses has the same phase as the phase of the corrective first phase current, and the plural values of the corrective first phase bus-based current are synchronized with the respective plural values of the corrective first phase current (2) The corrective second phase bus-based current flowing through one of the first and second buses has the same phase as the phase of the corrective second phase current, and the plural values of the corrective second phase bus-based current are synchronized with the respective plural values of the corrective second phase current This configuration therefore results in elimination of (1) A first deviation between the corrective first phase current and the corrective first phase bus-based current (2) A second deviation between the corrective second phase current and the corrective second phase bus-based current This therefore results in the current detection apparatus having higher correction accuracy of each of target first and second phase currents detected by the first current detector.

BRIEF DESCRIPTION OF THE DRAWINGS

Other aspects of the present disclosure will become apparent from the following description of an embodiment with reference to the accompanying drawings in which:

FIG. 2 is a table schematically illustrating the relationships among (I) voltage vectors of an output voltage of an inverter, (II) phase currents detectable based on a bus current, and (III) phase currents detectable based on arm currents according to the first embodiment;

FIG. 19 is a table schematically illustrating the relationships among (I) voltage vectors of the output voltage of the inverter, (II) phase currents detectable based on a bus current, and (III) phase currents detectable based on arm currents according to the second embodiment;

DETAILED DESCRIPTION OF EMBODIMENT

Figure 1:
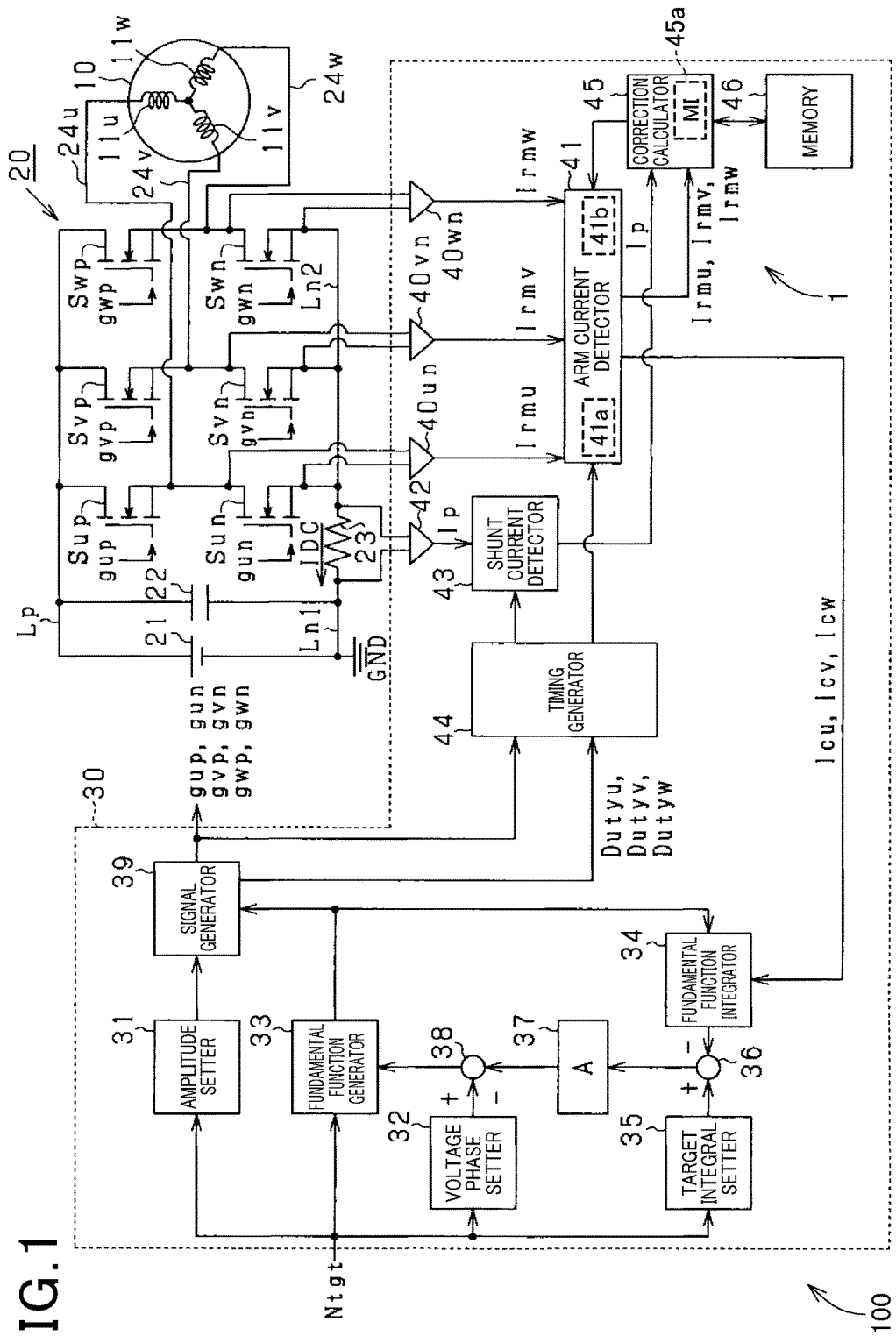
FIG. 1 is a circuit and block diagram schematically illustrating an example of the overall structure of a motor system according to the first embodiment of the present disclosure.

The following describes embodiments of the present disclosure with reference to the accompanying drawings. In the embodiments, like parts between the embodiments, to which like reference characters are assigned, are omitted or simplified to avoid redundant description.

First Embodiment

The following describes a motor system 100 including a control apparatus 30, which includes a current detection apparatus 1 according to the first embodiment of the present disclosure, for controlling a motor 10 as an example of rotary electric machines.

As illustrated in FIG. 1, the motor system 100 is for example installed in a vehicle, and includes the motor 10, an inverter 20, and the control apparatus 30. The first embodiment uses a three-phase synchronous motor, such as three-phase permanent magnet synchronous motor, as the motor 10. The first embodiment uses the motor 10 to drive vehicle-mounted auxiliary devices, such as a radiator fan, a blower of an air conditioner, and a water pump.

The inverter 20 includes a first pair of series-connected upper- and lower-arm switches Sup and Sun, a second pair of series-connected upper- and lower-arm switches Svp and Svn, and a third pair of series-connected upper- and lower-arm switches Swp and Swn; the number of pairs of switches corresponds to the number of, for example three, phases of the motor 10.

For example, the motor 10 includes a direct axis (d-axis) in line with a direction of magnetic flux created by an N pole of at least one pair of permanent magnets thereof. For example, the motor 10 also includes a quadrature axis (q-axis) with a phase being π/2-radian electrical angle leading with respect to a corresponding d-axis during rotation of the motor 10. In other words, the q-axis is electromagnetically perpendicular to the d-axis. The d and q axes constitute a d-q coordinate system, i.e. a two-phase rotating coordinate system, defined in the motor 10.

The motor 10 also includes unillustrated three-phase windings, such as U-, V-, and W-phase windings.

The connection point between upper- and lower-arm switches Sup and Sun is connected to a first end of the U-phase winding of the motor 10 via a U-phase conducive member 24U, such as a bus, and the connection point between upper- and lower-arm switches Svp and Svn is connected to a first end of the V-phase winding of the motor 10 via a V-phase conducive member 24V, such as a bus. The connection point between upper- and lower-arm switches Swp and Swn is connected to a first end of the W-phase winding of the motor 10 via a W-phase conducive member 24W, such as a bus.

Second ends of the U-, V-, and W-phase windings are connected to a common junction, i.e. a neutral point, in, for example, a star-configuration (Y-configuration). Note that the first embodiment uses voltage-controlled semiconductor switches, such as N channel MOSFETs, as the respective switches Sup, Sun, Svp, Svn, Swp, and Swn. Intrinsic diodes are connected in anti-parallel to the respective switches Sup, Sun, Svp, Svn, Swp, and Swn.

The motor system 100 also includes a battery 21, which serves as a direct-current (DC) power source, and a smoothing capacitor 22.

Drains, which are input terminals of the U-, V-, and W-phase upper-arm switches Sup, Svp, and Swp, are connected to a positive bus Lp, and the positive bus Lp is connected to the positive terminal of the battery 21. The smoothing capacitor 22 has opposing positive and negative electrodes, the positive electrode of which is connected to the positive bus Lp. The negative terminal of the battery 21 and the negative electrode of the smoothing capacitor 22 are connected to each other via a first negative bus Ln. This results in the battery 21 and the smoothing capacitor 22 being connected in parallel to each other.

Sources, which are output terminals of the U-, V-, and W-phase lower arm switches Sun, Svn, and Swn, are connected to a second negative bus Ln2.

The motor system 100 further includes a shunt resistor 23 connected between the first negative bus Ln1 and the second negative bus Ln2. Specifically, the shunt resistor 23 has opposing first and second ends, the first negative bus Ln1 has opposing first and second ends, the first end of the first negative bus Ln1 is connected to the negative terminal of the battery 21, and the second end of the first negative bus Ln1, to which the negative electrode of the smoothing capacitor 22 is connected, is connected to the first end of the shunt resistor 23. In addition, the second negative bus Ln2 has opposing first and second ends, the first end of the second negative bus Ln2, which is closer to the negative terminal of the battery 21 than the second end is, is connected to the second end of the shunt resistor 23.

The control apparatus 30 mainly includes a microprocessor, and drives the inverter 20 to control the rotational speed of the motor 10 at a commanded rotational speed Ntgt; the rotational speed is an example of controlled variables of the motor 10. The control apparatus 30 according to the first embodiment specially executes feedback control of the rotational speed of the motor 10 using a method described in Japanese Patent Application Publication No. 2004-64860 (see FIG. 1) without using information on the rotational angle of the motor 10, which is usually measured by a rotation angle sensor, such as a Hall element or resolver. The following describes this specific feedback control of the rotational speed of the motor 10 hereinafter.

The control apparatus 30 functionally includes an amplitude setter 31, a voltage phase setter 32, a fundamental function generator 33, and a fundamental function integrator 34. The control apparatus 30 also functionally includes a target integral setter 35, a first deviation calculator 36, a gain multiplication unit 37, a second deviation calculator 38, and a signal generator 39. These units 31 to 39 of the control apparatus 30 can be implemented as hardware modules, software modules, and/or hardware-software hybrid modules.

The amplitude setter 31 sets a voltage amplitude, which is the amplitude of a voltage vector of the inverter 20, on the basis of the commanded rotational speed Ntgt of the motor 10. The voltage amplitude according to the first embodiment is defined as the square root of the sum of the square value of a d-axis voltage Vd and the square value of a q-axis voltage Vq. The d- and q-axis voltages Vd and Vq are d- and q-axis components of the output voltage vector in the two-phase rotating coordinate system of the motor 10.

For example, the amplitude setter 31 can set the voltage amplitude based on previously measured map information where values of the commanded rotational speed Ntgt are associated with corresponding values of the voltage amplitude. Moreover, the commanded rotational speed Ntgt is input into the control apparatus 30 from, for example, a higher-level control apparatus than the control apparatus 30.

The voltage phase setter 32 sets a voltage-phase fundamental value, which is a fundamental value of the phase of the voltage vector, on the basis of the commanded rotational speed Ntgt. The phase of the voltage vector is defined as, for example, an angle formed by the d-axis and the voltage vector. For example, the voltage phase setter 32 can set the voltage-phase fundamental value based on previously measured map information where values of the commanded rotational speed Ntgt are associated with the corresponding voltage-phase fundamental values.

The fundamental function generator 33 determines an electrical angular velocity of the motor 10 based on the commanded rotational speed Ntgt. Then, the fundamental function generator 33 generates a sinusoidal fundamental function of a voltage applied to each of the three phases, i.e. three-phase windings, of the motor 10 on the basis of the determined electrical angular velocity and a corrected value of the voltage-phase fundamental value for the corresponding phase set by the voltage phase setter 32. The correction of the voltage-phase fundamental value for each phase set by the voltage phase setter 32 is carried out by a second deviation calculator 38 described below.

The sinusoidal fundamental functions of the voltages applied to the respective three phases of the motor 10 are sinusoidal signals that have a phase difference of 120 electrical degrees from each other.

The fundamental function integrator 34 integrates the sinusoidal fundamental function for each phase generated by the fundamental function generator 33 over a predetermined integration period to calculate a fundamental function integral. The fundamental function integrator 34 for example determines the integration period based on corrected phase currents Icu, Icv, and Icw output from an arm current detector 41 described later, which constitutes the current detection apparatus 1 according to the first embodiment.

The fundamental function integral for each phase represents a value correlating with the phase difference between a corresponding phase current flowing in the motor 10 and the sinusoidal fundamental function for the corresponding phase.

The target integral setter 35 sets, for each phase, a target integral on the basis of the commanded rotational speed Ntgt; the target integral for each phase is an integral of the corresponding sinusoidal fundamental function. The integral of the sinusoidal fundamental function for each phase matches with a target phase difference between a corresponding phase current flowing in the motor 10 and the corresponding sinusoidal fundamental function. For example, the target integral setter 35 can set the target integral based on map information where values of the commanded rotational speed Ntgt are associated with the corresponding values of the target integral.

The first deviation calculator 36 subtracts, for each phase, the corresponding fundamental function integral calculated by the fundamental function integrator 34 from the corresponding target integral set by the target integral setter 35. This calculates, for each phase, the deviation between the corresponding fundamental function integral and the corresponding target integral.

The gain multiplication unit 37 multiplies, for each phase, the deviation between the corresponding fundamental function integral and the corresponding target integral by a predetermined gain A. This calculates a multiplication value for each phase.

The second deviation calculator 38 subtracts, for each phase, the corresponding multiplication value, which is the product of the gain A and the deviation between the corresponding fundamental function integral and the corresponding target integral, from the voltage-phase fundamental value set by the voltage phase setter 32. This corrects the voltage phase fundamental value for each phase. Then, the second deviation calculator 38 sends the corrected voltage-phase fundamental value for each phase to the fundamental function generator 33, so that the fundamental function generator 33 uses the corrected voltage-phase fundamental value for each phase to thereby generate the sinusoidal fundamental functions of the voltage applied to the respective three-phases of the motor 10.

The signal generator 39 generates drive signals gup, gun, gyp, gvn, gwp, and gwn, which are pulse-width modulation (PWM) signals, based on the voltage amplitude set by the amplitude setter 31 and the sinusoidal fundamental functions for the respective phases generated by the fundamental function generator 33 using known three-phase modulation. Then, the signal generator 39 outputs the drive signals gup, gun, gyp, gvn, gwp, and gwn to the control terminals of the respective switches Sup, Sun, Svp, Svn, Swp, and Swn of the inverter 20, thus individually controlling on-off switching operations of the respective switches Sup, Sun, Svp, Svn, Swp, and Swn. This enables the rotational speed of the motor 10 to be feedback controlled to the commanded rotational speed Ntgt. Note that the drive signals gup, gyp, and gwp on the upper-arm side and the corresponding drive signals gun, gvn, and gwn on the lower-arm side are complemental signals to each other. In other words, the upper-arm switch and the lower-arm switch of each phase are alternately turned on.

Specifically, the signal generator 39 calculates U-, V-, W-phase command duties Dutyu, Dutyv, and Dutyw, i.e. normalized command voltages, based on the voltage amplitude and the sinusoidal fundamental functions; the U-, V-, W-phase command duties Dutyu, Dutyv, and Dutyw have a phase difference of 120 electrical degrees from each other.

The command duties Dutyu, Dutyv, and Dutyw according to the first embodiment are sinusoidal signals, and are normalized by half of the voltage across the battery 21.

Figure 3:
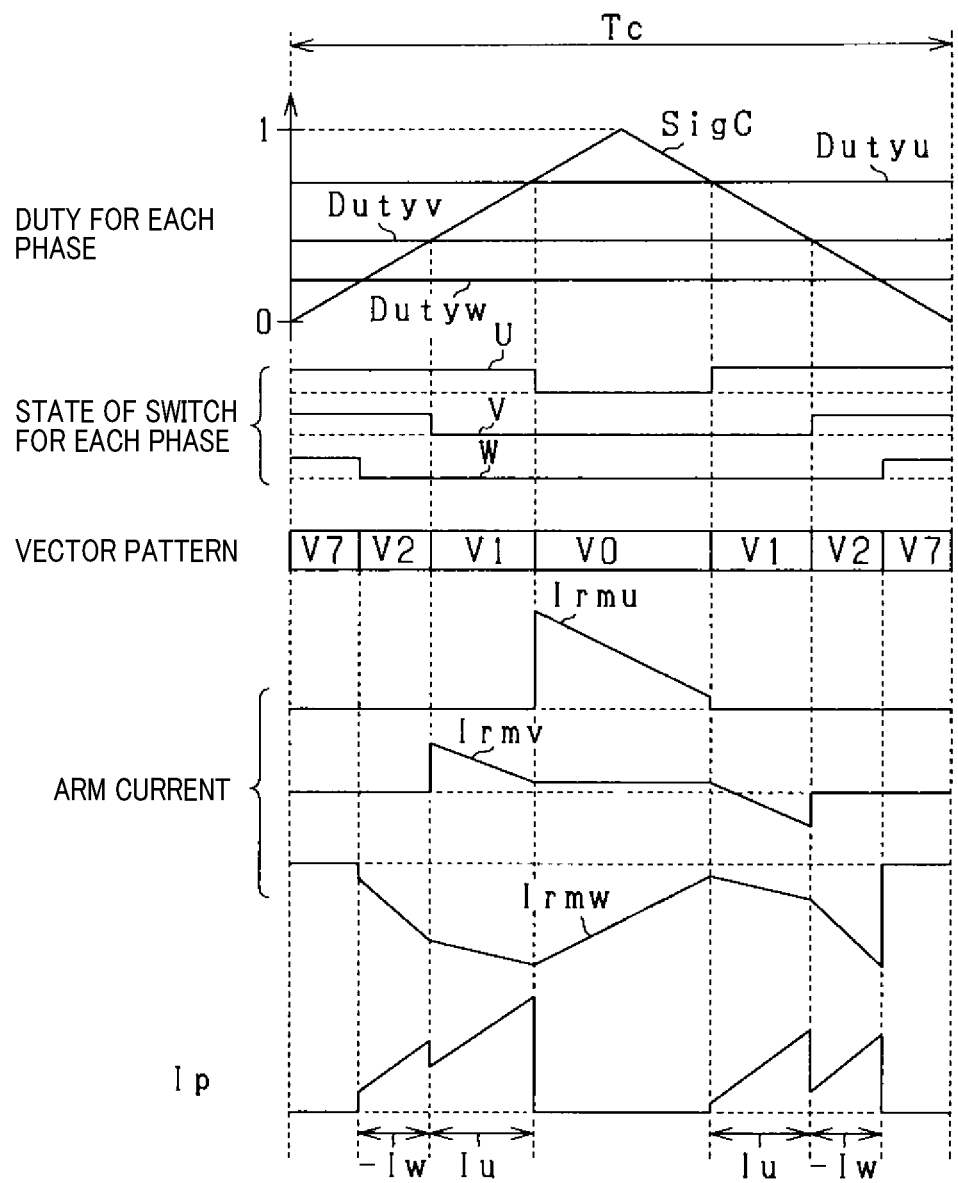
FIG. 3 is a timing chart schematically illustrating an example of detection timings of the arm currents and the bus current according to the first embodiment.

The signal generator 39 performs pulse width modulation based on comparison in magnitude between each of the command duties Dutyu, Dutyv, and Dutyw and a carrier signal SigC, thus generating a corresponding one of the drive signals gup, gun, gyp, gvn, gwp, and gwn. In the first embodiment, as illustrated in FIG. 3, the carrier signal SigC is a triangle wave signal having an amplitude of 1, and having the signal up-sweep and signal down-sweep being equal but opposite in sign. The carrier signal SigC increases from zero up to 1 at a first half cycle, and decreases from 1 to zero at a second half cycle as illustrated in FIG. 3.

Note that the amplitude setter 31, voltage phase setter 32, fundamental function generator 33, fundamental function integrator 34, target integral setter 35, first deviation calculator 36, gain multiplication unit 37, second deviation calculator 38, and signal generator 39 serve as, for example, a switch controller.

The control apparatus 30 includes the current detection apparatus 1 that detects the phase currents used to control the rotational speed of the motor 10. The current detection apparatus 1 performs the task of detecting the phase currents on the basis of the voltage drops across the shunt resistor 23, and the task of detecting the phase currents on the basis of input-output voltages, i.e. source-drain voltages, of the lower-arm switches of at least two phases. In the first embodiment, the lower-arm switches correspond to respective detection switches.

The following describes the task of detecting the phase currents on the basis of the voltage drops across the shunt resistor 23 first.

As illustrated in FIG. 2, one phase current in accordance with the voltage vector flows through the shunt resistor 23 in each period during which the voltage vector of the inverter 20 is a corresponding one of voltage vectors V1 to V6. One phase current in accordance with the voltage vector can be therefore detected on the basis of the voltage drop across the shunt resistor 23. Each of two voltage vectors appears twice in one cycle of the carrier signal SigC between the rising edge and the falling edge of the carrier signal SigC. Accordingly, each of two phase currents can be detected twice in one cycle of the carrier signal SigC. FIG. 3 illustrates an example where, in one cycle of the carrier signal SigC, 1. A bus current IDC, flowing through the first and second negative buses Ln1 and Ln2, is detected as a W-phase current Iw in a period during which the voltage vector is the even-numbered voltage vector V2

2. The bus current IDC, flowing through the first and second negative buses Ln1 and Ln2, is detected as a U-phase current Iu in a period during which the voltage vector is an odd-numbered voltage vector V1

As illustrated in FIG. 2, the voltage vectors V1 to V6 will also be referred to as first to sixth voltage vectors V1 to V6. For example, the first voltage vector V1 represents that the switches Sup, Svn, and Swn are in the on state, in other words, the remaining switches Sun, Svp, and Swp are in the off state. Note that a zeroth voltage vector V0 represents that all the switches Sun, Svn, and Swn are in an on state, in other words, the remaining switches Sup, Svp, and Swp are in an off state. A seventh voltage vector V7 also represents that all the switches Sup, Svp, and Swp are in the on state, in other words, the remaining switches Sun, Svn, and Swn are in the off state. For the other seventh to sixth voltage vectors V2 to V6 please refer to FIG. 2.

The voltage vectors V0 and V7 express that all of the three-phase windings are short-circuited so that line-to-line voltages between the three-phase windings of the motor-generator 10 are all zero. Thus, the voltage vectors V0 and V7 will be referred to as zeroth voltage vectors hereinafter.

In contrast, each of the remaining voltage vectors V1 to V6 express a switching mode in which at least one of the high-side switches and at least one of the low-side switches are ON, so that line-to-line voltages between the three-phase windings of the motor-generator 10 effectively appear. Thus, the voltage vectors V1 to V6 will also be referred to as active voltage vectors V1 to V6 hereinafter.

In the first embodiment, the direction in which a current flowing from the side of the inverter 20 to the side of the negative terminal of the battery 21 through the shunt resistor 23 is defined as a positive direction. Moreover, the direction of a current flowing from the side of the inverter 20 to the side of the motor 10 is defined as a positive direction. The negative sign is therefore assigned for a bus current IDC in the column "1 SHUNT (IDC)" of FIG. 2 when the sign of a phase current detected by the shunt resistor 23 is different from that of a corresponding actual phase current.

As illustrated in FIG. 1, the current detection apparatus 1 functionally includes an amplifier 42, a shunt current detector 43 serving as, for example, a second current detector, and a timing generator 44; the units 42, 43, and 44 aim to detect a phase current based on a corresponding value of the voltage drop across the shunt resistor 23.

The amplifier 42 amplifies and outputs a signal indicative of a value of the voltage drop across the shunt resistor 23 based on a phase current flowing through the shunt resistor 23 as the bus current IDC.

The shunt current detector 43 detects, as a corrective phase current Ip, the output signal of the amplifier 42 each time a detection timing is instructed thereto by the timing generator 44.

Next, the following describes the process of detecting phase currents on the basis of the voltages between the sources and the drains of the respective U-, V-, and W-phase lower arm switches Sup, Svp, and Swp.

As illustrated in FIG. 2, one to three phase currents flow through the lower arm switches, each of which is in an ON period, in accordance with the voltage vectors V0 to V6. Note that, in the first embodiment, the sign of the source-drain voltage between the source and the drain of a lower-arm switch when the drain potential of the lower-arm switch is higher than its source potential is defined as positive. Moreover, the direction in which an actual phase current flows from the side of the inverter 20 to the side of the motor 10 is defined as the positive direction as described above. The negative sign is therefore assigned for a bus current IDC in the field "1 SHUNT (IDC)" of FIG. 2 when the sign of a phase current detected by the shunt resistor 23 is different from that of a corresponding actual phase current.

As illustrated in FIG. 1, the current detection apparatus 1 includes U-, V-, and W-phase lower-arm amplifiers 40un, 40vn, and 40wn, an arm current detector 41, and the timing generator 44; these units 40un, 40vn, and 40wn, 41, and 44 aim to detect phase currents on the basis of the voltages between the sources and the drains of the respective lower arm switches Sun, Svn, and Swn.

The U-, V-, and W-phase lower-arm amplifiers 40un, 40vn, and 40wn amplify and output the voltages between the sources and the drains of the respective U-, V-, and W-phase lower-arm switches Sun, Svn, and Swn.

The arm current detector 41 includes, for example, a current detection unit 41a and a current correction unit 41b. The current detection unit 41a detects the output signals of the lower-arm amplifiers 40un, 40vn, and 40wn as three phase currents at a current detection timing instructed by the timing generator 44.

Figure 4:
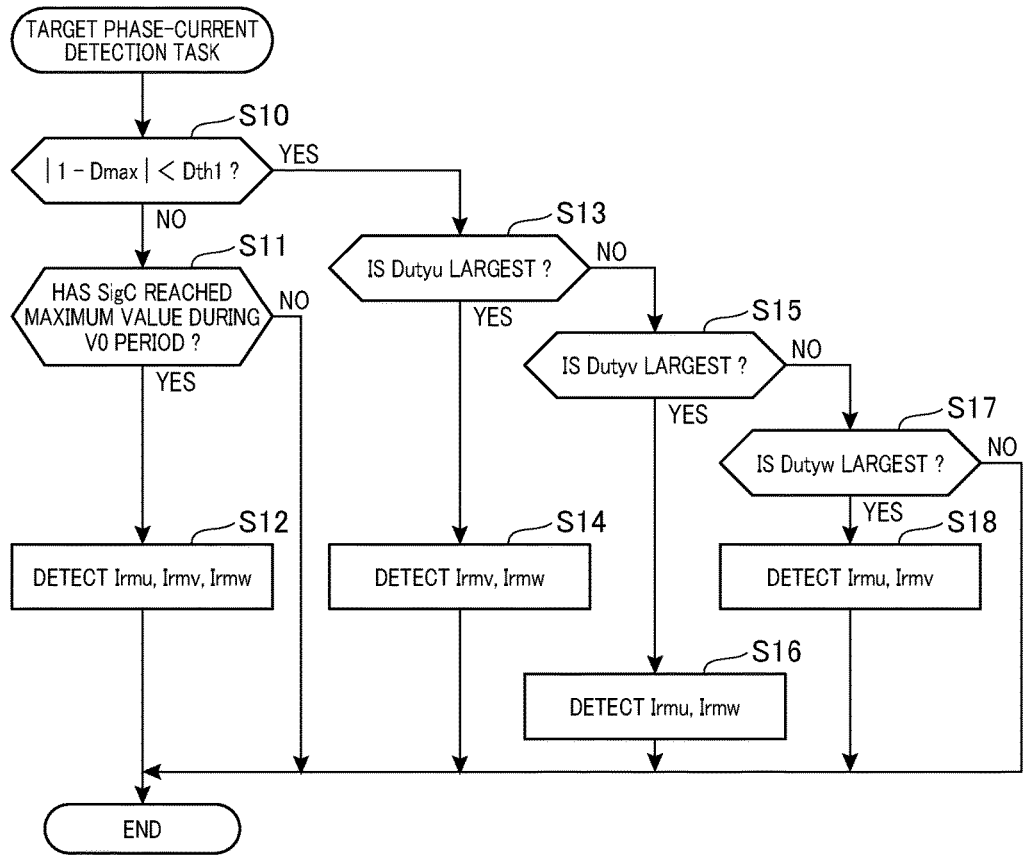
FIG. 4 is a flowchart schematically illustrating a target phase-current detection task according to the first embodiment.

Next, the following describes a target phase-current detection task, which is carried out by the timing generator 44 every predetermined period, for instructing the arm current detector 41, i.e. the current detection unit 41a, about a current detection timing (see FIG. 4).

In step S10, the timing generator 44 selects, from the U-, V-, W-phase command duties Dutyu, Dutyv, and Dutyw calculated by the signal generator 39, one of the U-, V-, W-phase command duties Dutyu, Dutyv, and Dutyw, which is the highest of them as a maximum command duty Dmax.

Next, the timing generator 44 calculates an absolute value of the difference of the maximum command duty Dmax from the maximum value of the carrier signal SigC, which is 1, and determines whether the calculated absolute value is smaller than a first time threshold DTh1 in step S10. This operation in step S10 aims to determine whether there is a possibility of deterioration in the detection accuracy of phase currents during the period of the zeroth voltage vector V0 being set to the voltage vector of the inverter 20. Hereinafter, this period will also be referred to as the period of the zeroth voltage vector V0.

Switching the voltage vector of the inverter 20 to another voltage vector may cause ringing to be generated in the drain-source voltage across at least a corresponding switched lower-arm switch, resulting in an error component due to the ringing in a phase current calculated based on the corresponding switched lower-arm switch. Detecting a phase current during ringing being generated may cause the detection accuracy of the phase current to deteriorate.

Assuming that a period required for ringing generated in a switched switch to have sufficiently decreased since a corresponding voltage vector switching timing is referred to as a filter period Tsta, a detection timing of a phase current corresponding to the switched switch is preferably set at a time after the filter period Tsta has elapsed since the voltage vector switching timing.

Figure 5:
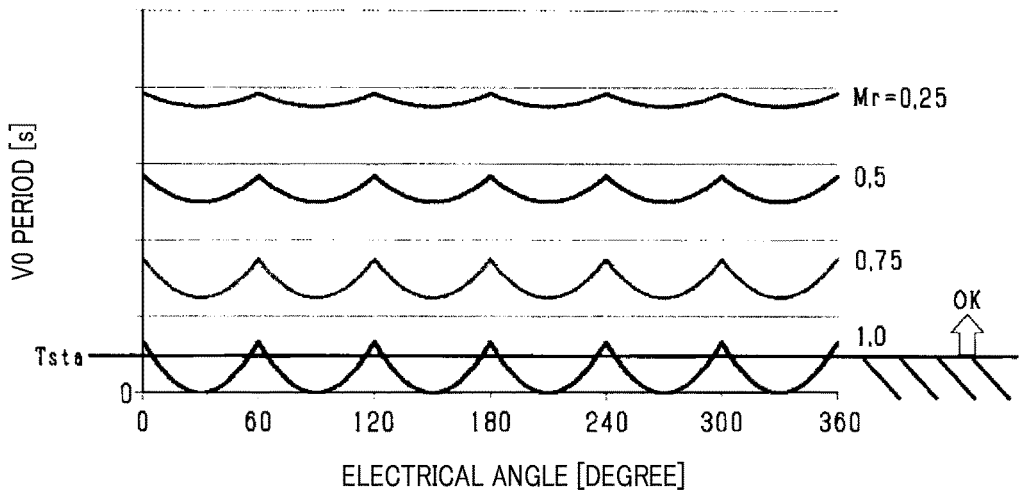
FIG. 5 is a graph schematically illustrating an example of a relationship between the length of a zeroth voltage vector and a modulation factor according to the first embodiment.

However, as illustrated in FIG. 5, an increase in the modulation factor Mr of the inverter 20 causes the period during which the zeroth voltage vector V0 appears in one cycle Tc of the carrier signal SigC, i.e. one switching cycle of each arm switch, to decrease. Note that the modulation factor Mr of the inverter 20 is defined as a ratio of the voltage amplitude to the half of the inverter input voltage, and is correlated with the U-, V-, W-phase command duties Dutyu, Dutyv, and Dutyw.

A further increase in the modulation factor Mr causes the period during which the zeroth voltage vector V0 appears in one cycle Tc of the carrier signal SigC to be shorter than the filter period Tsta. Even if three-phase currents can be detected during the period of the zeroth voltage vector V0 that is shorter than the filter period Tsta, the detection accuracy may deteriorate. For this reason, it is preferable to avoid detection of the three-phase currents during the period of the zeroth voltage vector V0 in one cycle Tc of the carrier signal SigC, which is shorter than the filter period Tsta.

Note that the absolute value of the difference of the maximum command duty Dmax from the maximum value of the carrier signal SigC, which is 1, has a positive correlation with the period during which the voltage vector of the inverter 20 being set to the voltage vector V0. For this reason, the operation in step S10 makes it possible to determine whether the period during which the zeroth voltage vector V0 appears in one cycle of the carrier signal SigC is shorter than the filter period Tsta, thus determining whether there is a possibility of deterioration in the detection accuracy of the phase currents.

Upon determining that the calculated absolute value is equal to or larger than the first time threshold DTh1 (NO in step S10), the timing generator 44 determines whether the carrier signal SigC has reached a maximum value (MAX), i.e. a positive peak, during the period of the zeroth voltage vector V0 in step S11. This operation in step S11 aims to determine whether it is time to detect the three-phase currents. Note that whether the present voltage vector of the inverter 20 is the zeroth voltage vector V0 can be determined based on the drive signals gup, gun, gyp, gvn, gwp, and gwn output from the signal generator 39.

Figure 6:
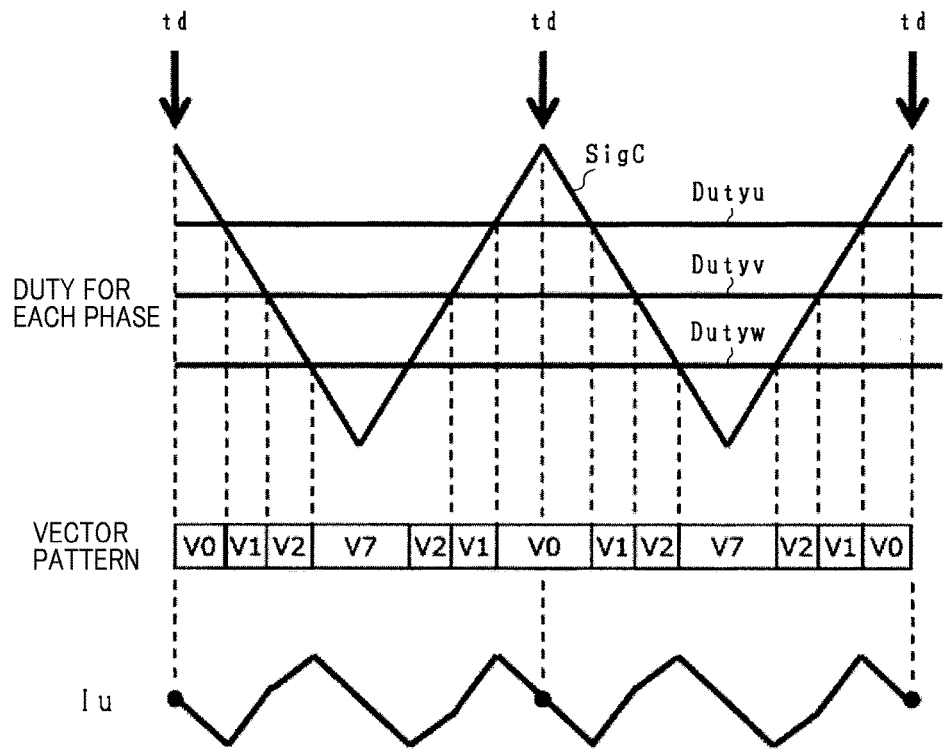
FIG. 6 is a timing chart schematically illustrating an example of detecting timings of U-phase currents according to the first embodiment.

Upon determining that the carrier signal SigC has reached the maximum value (MAX) during the period of the zeroth voltage vector V0 (YES in step S11), the timing generator 44 instructs the current detection unit 41a to detect the output signals of the respective U-, V- and W-phase lower-arm amplifiers 40un, 40vn, and 40wn as U-, V-, and W-phase currents Irmu, Irmv, and Irmw in step S12. FIG. 6 schematically illustrates timing td at which the carrier signal SigC has reached the maximum value (MAX) during the period of the zeroth voltage vector V0. This timing td enables each of the U-, V-, and W-phase currents Irmu, Irmv, and Irmw, which includes ripples, to be detected at the center of the variation in the corresponding phase current.

Otherwise, upon determining that the carrier signal SigC has not reached the maximum value (MAX) during the period of the zeroth voltage vector V0 (NO in step S11), the timing generator 44 terminates the target phase-current detection task.

Upon determining that the calculated absolute value is smaller than the first time threshold DTh1 (YES in step S10), the timing generator 44 determines whether the U-phase command duty Dutyu is the largest in the U-, V-, W-phase command duties Dutyu, Dutyv, and Dutyw in step S13. This operation in step S13 aims to determine whether it is time to detect two-phase currents, i.e. V- and W-phase currents.

Upon determining that the U-phase command duty Dutyu is the largest in the U-, V-, W-phase command duties Dutyu, Dutyv, and Dutyw (YES in step S13), the timing generator 44 instructs the current detection unit 41a to detect the output signals of the respective V- and W-phase lower-arm amplifiers 40vn and 40wn as V- and W-phase currents Irmv and Irmw in step S14.

Otherwise, upon determining that the U-phase command duty Dutyu is not the largest in the U-, V-, W-phase command duties Dutyu, Dutyv, and Dutyw (NO in step S13), the timing generator 44 determines whether the V-phase command duty Dutyv is the largest in the U-, V-, W-phase command duties Dutyu, Dutyv, and Dutyw in step S15.

Upon determining that the V-phase command duty Dutyv is the largest in the U-, V-, W-phase command duties Dutyu, Dutyv, and Dutyw (YES in step S15), the timing generator 44 instructs the current detection unit 41a to detect the output signals of the respective U- and W-phase lower-arm amplifiers 40un and 40wn as U- and W-phase currents Irmu and Irmw in step S16.

Otherwise, upon determining that the V-phase command duty Dutyv is not the largest in the U-, V-, W-phase command duties Dutyu, Dutyv, and Dutyw (NO in step S15), the timing generator 44 determines whether the W-phase command duty Dutyw is the largest in the U-, V-, W-phase command duties Dutyu, Dutyv, and Dutyw in step S17.

Upon determining that the W-phase command duty Dutyw is the largest in the U-, V-, W-phase command duties Dutyu, Dutyv, and Dutyw (YES in step S17), the timing generator 44 instructs the current detection unit 41a to detect the output signals of the respective U- and V-phase lower-arm amplifiers 40un and 40vn as U- and V-phase currents Irmu and Irmv in step S18.

Otherwise, upon determining that the W-phase command duty Dutyw is not the largest in the U-, V-, W-phase command duties Dutyu, Dutyv, and Dutyw (NO in step S17), the timing generator 44 terminates the target phase-current detection task.

Figure 7:
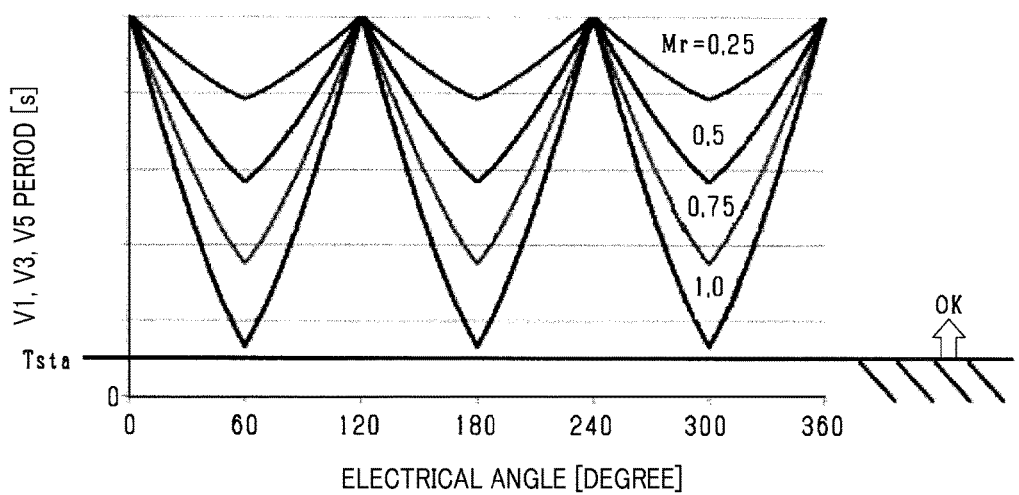
FIG. 7 is a graph schematically illustrating an example of a relationship between the length of each of first, third, and fifth voltage vectors and the modulation factor according to the first embodiment.

The reason why detection of two-phase currents is permitted upon the corresponding one of the determinations in steps S13, S15, and S17 being affirmative according to the first embodiment is that, as illustrated in FIG. 7, even if the modulation factor Mr has reached its maximum value, i.e. a negative peak, the period of each of the odd vectors V1, V3, and V5 during one switching cycle is prevented from being shorter than the filter period Tsta. Note that it is preferable to avoid current detection timings from being set during ringing generation periods.

Note that the source-drain voltage across each of the lower-arm switches Sun, Svn, and Swn upon a predetermined drain current Id flowing through the corresponding lower-arm switch may vary due to the individual differences and temperatures of the lower-arm switches Sun, Svn, and Swm. A variation in the source-drain voltage across each of the lower-arm switches Sun, Svn, and Swn may cause the amplitudes of the detected three-phase currents to vary.

Controlling the rotational speed of the motor 10 based on the three-phase currents whose amplitudes vary might cause the controllability of the rotational speed to deteriorate resulting in, for example, fluctuations in the rotational speed.

Controlling the rotational speed of the motor 10 based on the three-phase currents whose amplitudes vary also might cause a value, such as zero, of each of the detected phase currents at the center of its peak-to-peak variation to have an offset error relative to an actual value of the corresponding actual phase currents at the center of its peak-to-peak variation. This also may cause the controllability of the rotational speed to deteriorate.

From this viewpoint, the current detection apparatus 1 according to the first embodiment is specially configured such that the timing generator 44 corrects each phase current detected by the arm current detector 41 in accordance with the corresponding one of the phase currents detected by the shunt current detector 43.

Specifically, the timing generator 44 is configured to perform a corrective phase-current detection task, and the control apparatus 30 includes a correction value calculator 45, a memory 46 serving as, for example, a storage, and the arm current detector 41.

Figure 8:
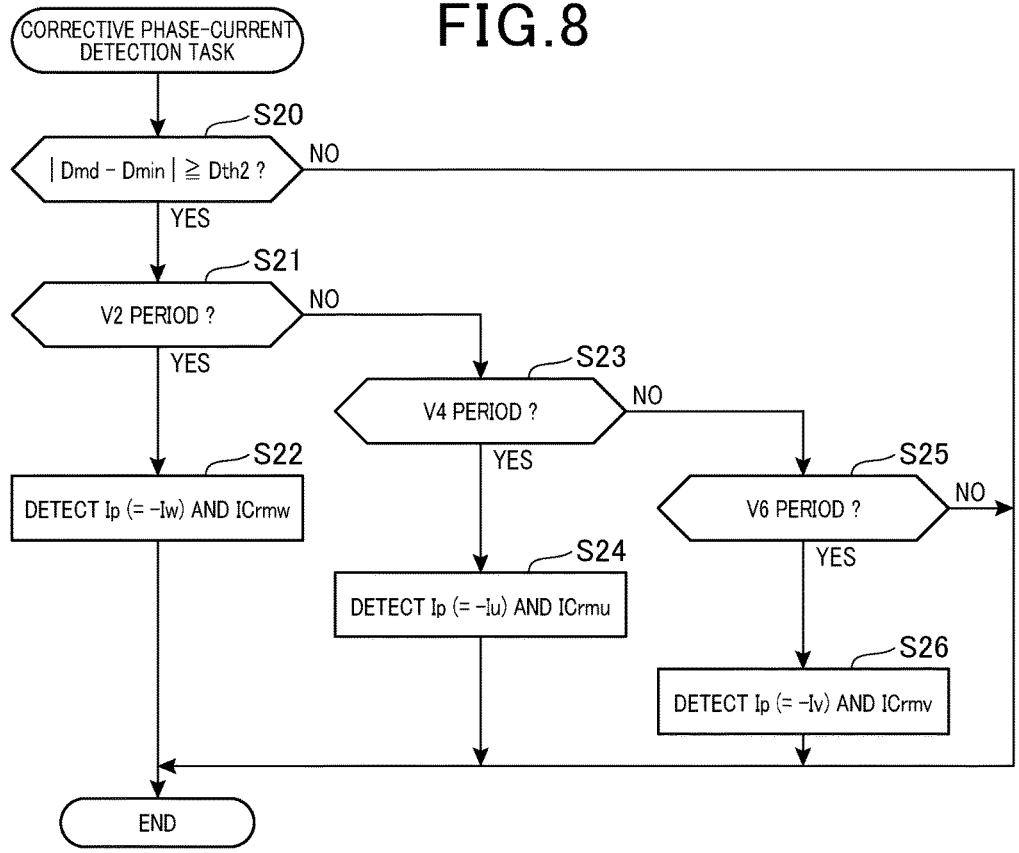
FIG. 8 is a flowchart schematically illustrating a corrective phase-current detection task according to the first embodiment.

Next, the following describes the corrective phase-current detection task, which is carried out by the timing generator 44 every predetermined period, for instructing each of the arm current detector 41 and the shunt current detector 43 about a current detection timing (see FIG. 8).

In step S20, the timing generator 44 selects, from the U-, V-, W-phase command duties Dutyu, Dutyv, and Dutyw calculated by the signal generator 39, the middle one of the U-, V-, W-phase command duties Dutyu, Dutyv, and Dutyw as a middle command duty Dmd, and the lowest one of the U-, V-, W-phase command duties Dutyu, Dutyv, and Dutyw as a minimum command duty Dmin.

Next, the timing generator 44 calculates an absolute value of the difference of the minimum command duty Dmin from the middle command duty Dmd, and determines whether the calculated absolute value is equal to or larger than a second time threshold DTh2 in step S20. This operation in step S20 aims to determine whether to simultaneously detect a phase current based on the voltage drop across the shunt resistor 23 and a phase current based on the drain-source voltage across the corresponding phase lower-arm switch.

Simultaneous detection of a phase current based on the voltage drop across the shunt resistor 23 and a phase current based on the drain-source voltage across the corresponding phase lower-arm switch according to the first embodiment can be carried out when the voltage vector of the inverter 20 is set to one of the even voltage vectors V2, V4, and V6.

Figure 9:
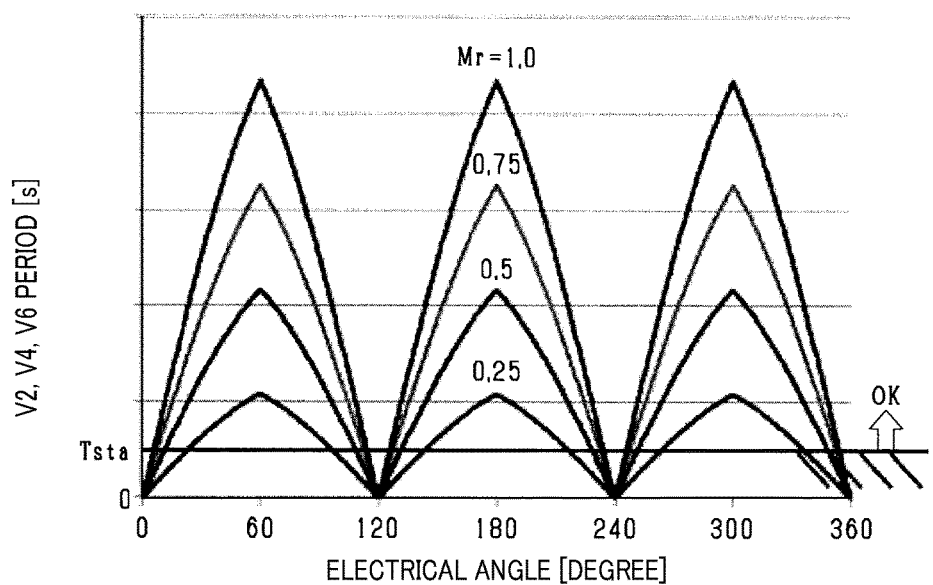
FIG. 9 is a graph schematically illustrating an example of a relationship between the length of each of second, fourth, and sixth voltage vectors and the modulation factor according to the first embodiment.

However, as illustrated in FIG. 9, for performing the simultaneous detection, it is necessary for the period during which each of the even voltage vectors V2, V4, and V6 to appear in one cycle of the carrier signal SigC to have a value equal to or longer than the filter period Tsta.

Note that the absolute value of the difference of the minimum command duty Dmin from the middle command duty Dmd has a positive correlation with the period during which the voltage vector of the inverter 20 being set to each of the even voltage vectors V2, V4, and V6. For this reason, the operation in step S20 makes it possible to determine whether the period during which each of the even voltage vectors V2, V4, and V6 appears in one cycle of the carrier signal SigC is equal to or longer than the filter period Tsta.

Upon determining that the calculated absolute value is equal to or larger than the second time threshold DTh2 (YES in step S20), the timing generator 44 determines whether the voltage vector of the inverter 20 is set to the second voltage vector V2 in step S21. Upon determining that the voltage vector of the inverter 20 is set to the second voltage vector V2 (YES in step S21), the timing generator 44 instructs (1) The shunt current detector 43 to detect, based on the output of the amplifier 42, the corrective phase current Ip as a negative W-phase current −Iw (2) The current detection unit 41a to detect the output signal of the W-phase arm amplifier 40wn as a corrective W-phase current ICrmw in step S22.

The respective units 43 and 41a store the detected corrective current values (Ip=−Iw) and ICrmw in the memory 46.

Otherwise, upon determining that the voltage vector of the inverter 20 is not set to the second voltage vector V2 (NO in step S21), the timing generator 44 determines whether the voltage vector of the inverter 20 is set to the fourth voltage vector V4 in step S23. Upon determining that the voltage vector of the inverter 20 is set to the fourth voltage vector V4 (YES in step S23), the timing generator 44 instructs (1) The shunt current detector 43 to detect, based on the output of the amplifier 42, the corrective phase current Ip as a negative U-phase current −Iu (2) The current detection unit 41a to detect the output signal of the U-phase lower-arm amplifier 40un as a corrective U-phase current ICrmu in step S24.

The respective units 43 and 41a store the detected corrective current values (Ip=−Iu) and ICrmu in the memory 46.

Otherwise, upon determining that the voltage vector of the inverter 20 is not set to the second voltage vector V4 (NO in step S23), the timing generator 44 determines whether the voltage vector of the inverter 20 is set to the sixth voltage vector V6 in step S25. Upon determining that the voltage vector of the inverter 20 is set to the sixth voltage vector V6 (YES in step S25), the timing generator 44 instructs (1) The shunt current detector 43 to detect, based on the output of the amplifier 42, the corrective phase current Ip as a negative V-phase current −Iv (2) The current detection unit 41a to detect the output signal of the V-phase lower-arm amplifier 40vn as a corrective V-phase current ICrmv in step S26

The respective units 43 and 41a respectively store the detected corrective current values (Ip=−Iv) and ICrmv in the memory 46.

Otherwise, upon determining that the voltage vector of the inverter 20 is not set to the sixth voltage vector V6 (NO in step S25), the timing generator 44 terminates the corrective phase-current detection task.

On the other hand, upon determining that the calculated absolute value is smaller than the second threshold DTh2 (NO in step S20), the timing generator 44 terminates the corrective phase-current detection task.

Figure 10:
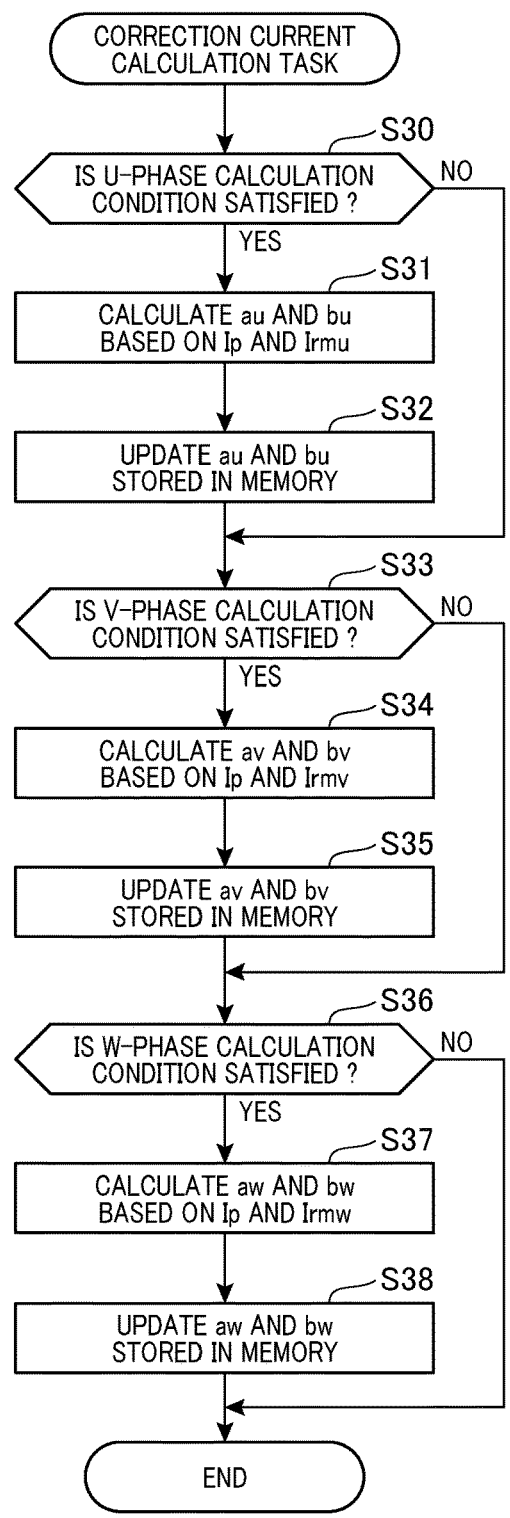
FIG. 10 is a flowchart schematically illustrating a correction current calculation task according to the first embodiment.

Next, the following describes a correction current calculation task, which is carried out by the correction value calculator 45 every predetermined period (see FIG. 10). Note that one correction current calculation task periodically performed by the correction value calculator 45 will be referred to as a cycle.

Upon starting a current cycle of the correction current calculation task, the correction value calculator 45 determines whether a calculation condition for a U-phase correction gain au and a U-phase offset correction value bu is satisfied in step S30. The calculation condition for the U-phase correction gain au and U-phase offset correction value bu can be set to a condition that the number of pairs of the corrective U-phase current values Ip=(−Iu) and the corrective current values ICrmu detected by the respective units 43 and 41a in step S24 and stored in the memory 46 becomes a predetermined number equal to or more than 2.

Upon determining that the calculation condition for the U-phase correction gain au and U-phase offset correction value bu is satisfied (YES in step S30), the correction value calculator 45 calculates the U-phase correction gain au and U-phase offset correction value bu in accordance with the pairs of the corrective U-phase current values Ip=(−Iu) and the corrective current values ICrmu detected by the respective units 43 and 41 in step S31.

Figure 11:
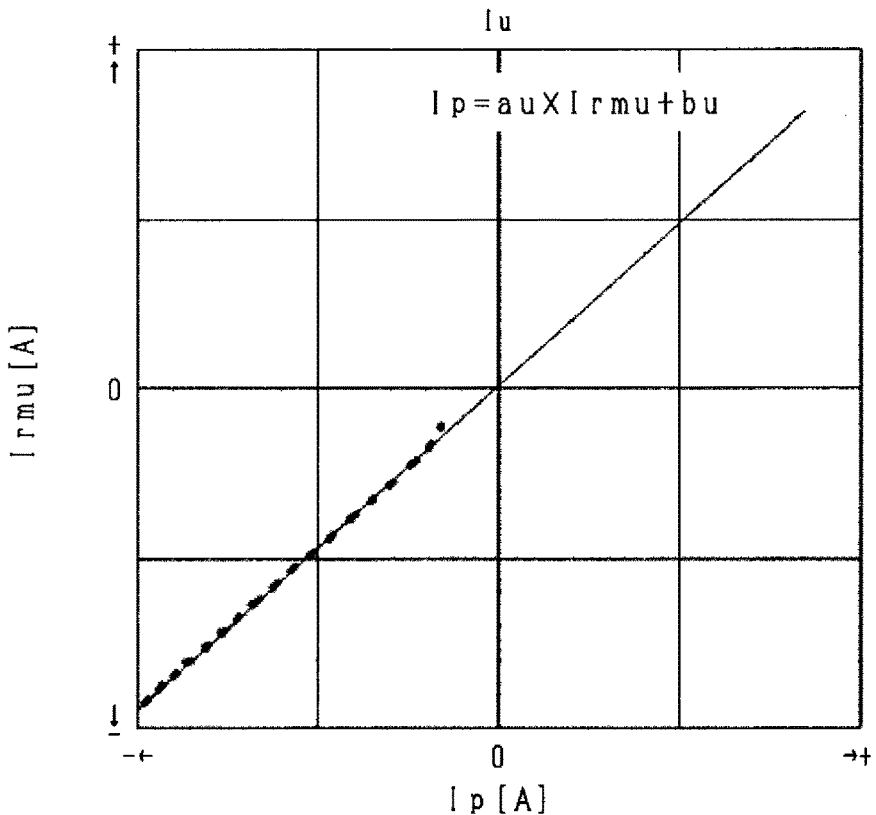
FIG. 11 is a graph schematically illustrating how to calculate a correction gain and an offset correction value according to the first embodiment.

Referring to FIG. 11, the correction value calculator 45 according to the first embodiment calculates, based on the pairs of (Ip1, ICrmu1), . . . , (Ipm, ICrmum) stored in the memory 46, the U-phase correction gain au and U-phase offset correction value bu using the method of least squares; m represents the number of pairs of the corrective U-phase current values Ip=(−Iu) and the corrective current values ICrmu detected by the respective units 43 and 41a in step S24.

Note that the correction value calculator 45 according to the first embodiment can calculate, based on the pairs of (Ip1, ICrmu1), . . . , (Ipm, ICrmum) stored in the memory 46, the U-phase correction gain au and U-phase offset correction value bu using an interpolation method.

In step S32, the correction value calculator 45 stores the U-phase correction gain au and U-phase offset correction value bu calculated in the current cycle of the correction current calculation task in the memory 46, thus updating a previous U-phase correction gain au and a previous U-phase offset correction value bu stored in the memory 46 to the new U-phase correction gain au and U-phase offset correction value bu calculated in the current cycle of the correction current calculation task.

After completion of the operation in step S32 or the negative determination in step S30, the correction value calculator 45 determines whether a calculation condition for a V-phase correction gain av and a V-phase offset correction value by is satisfied in step S33. The calculation condition for the V-phase correction gain av and V-phase offset correction value by can be set to a condition that the number of pairs of the corrective V-phase current values Ip=(−Iv) and the corrective current values ICrmv detected by the respective units 43 and 41a in step S26 and stored in the memory 46 becomes a predetermined number equal to or more than 2.

Upon determining that the calculation condition for the V-phase correction gain av and V-phase offset correction value by is satisfied (YES in step S33), the correction value calculator 45 calculates the V-phase correction gain av and V-phase offset correction value by in accordance with the pairs of the corrective V-phase current values Ip=(−Iv) and the corrective current values ICrmv detected by the respective units 43 and 41a again step S34.

Like the operation in step S31, the correction value calculator 45 according to the first embodiment calculates, based on the pairs of (Ip1, ICrmv1), . . . , (Ipm, ICrmvm) stored in the memory 46, the V-phase correction gain av and V-phase offset correction value by using the method of least squares; m represents the number of pairs of the V-phase current values Ip=(−Iv) and the corrective current values ICrmv detected by the respective units 43 and 41a in step S26.

In step S35, the correction value calculator 45 stores the V-phase correction gain av and V-phase offset correction value by calculated in the current cycle of the correction current calculation task in the memory 46, thus updating a previous V-phase correction gain av and a previous V-phase offset correction value by stored in the memory 46 to the new V-phase correction gain av and V-phase offset correction value by calculated in the current cycle of the correction current calculation task.

After completion of the operation in step S35 or the negative determination in step S33, the correction value calculator 45 determines whether a calculation condition for a W-phase correction gain aw and a W-phase offset correction value bw is satisfied in step S36. The calculation condition for the W-phase correction gain aw and W-phase offset correction value bw can be set to a condition that the number of pairs of the corrective W-phase current values Ip=(−Iw) and the corrective current values ICrmw detected by the respective units 43 and 41a in step S22 and stored in the memory 46 becomes a predetermined number equal to or more than 2.

Upon determining that the calculation condition for the W-phase correction gain aw and W-phase offset correction value bw is satisfied (YES in step S36), the correction value calculator 45 calculates the W-phase correction gain aw and W-phase offset correction value bw in accordance with the pairs of the corrective W-phase current values Ip=(−Iw) and the corrective current values ICrmw detected by the respective units 43 and 41a in step S37.

Like the operation in step S31, the correction value calculator 45 according to the first embodiment calculates, based on the pairs of (Ip1, ICrmw1), . . . , (Ipm, ICrmwm) stored in the memory 46, the W-phase correction gain aw and W-phase offset correction value bw using the method of least squares; m represents the number of pairs of the corrective W-phase current values Ip=(−Iw) and the corrective current values ICrmw detected by the respective units 43 and 41a in step S22.

In step S38, the correction value calculator 45 stores the W-phase correction gain aw and W-phase offset correction value bw calculated in the current cycle of the correction current calculation task in the memory 46, thus updating a previous W-phase correction gain aw and a previous W-phase offset correction value bw stored in the memory 46 to the new W-phase correction gain aw and W-phase offset correction value bw calculated in the current cycle of the correction current calculation task.

After completion of the operation in step S38 or the negative determination in step S36, the correction value calculator 45 terminates the current cycle of the correction current calculation task.

Next, the following describes a correction task, which is carried out by the correction unit 41b of the arm current calculator 41 every predetermined period.

Upon starting the correction task, the correction unit 41b of the arm current calculator 41 obtains, from the memory 46, the U-, V-, and W-phase correction gains au, av, and aw and the U-, V-, and W-phase offset correction values bu, bv, and bw in step S40.

Next, the arm current calculator 41 calculates the product of the U-phase correction gain au and the U-phase current Irmu calculated in the target phase-current detection task illustrated in FIG. 4, and adds the calculated product (au·Irmu) to the offset correction value bu, thus calculating a corrected U-phase current Icu, which is expressed as Icu=au·Irmu+bu, in step S41.

Similarly, the arm current calculator 41 calculates the product of the V-phase correction gain av and the V-phase current Irmv calculated in the target phase-current detection task illustrated in FIG. 4, and adds the calculated product (av·Irmv) to the offset correction value bv, thus calculating a corrected V-phase current Icv, which is expressed as Icv=av·Irmv+bv, in step S41.

Additionally, the arm current calculator 41 calculates the product of the W-phase correction gain aw and the W-phase current Irmw calculated in the target phase-current detection task illustrated in FIG. 4, and adds the calculated product (aw·Irmw) to the offset correction value bw, thus calculating a corrected W-phase current Icw, which is expressed as Icw=aw·Irmw+bw, in step S41.

The arm current calculator 41 inputs the corrected U-, V-, and W-phase currents Icu, Icv, and Icw to the fundamental function integrator 34 in step S41, and thereafter, terminates the correction task.

Figure 12:
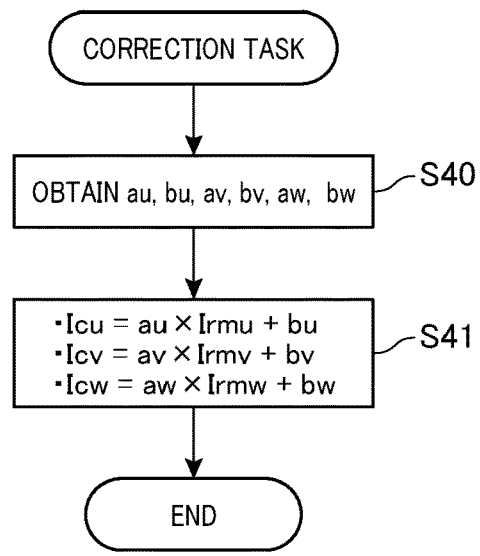
FIG. 12 is a flowchart schematically illustrating a correction task according to the first embodiment.

Note that, if two-phase currents are detected by the arm current detector 41 in step S14, S16, or S18 of the target phase-current detection task illustrated in FIG. 4, the arm current calculator 41 can be configured to correct the detected two-phase currents in accordance with the correction task illustrated in FIG. 12, and calculate the remaining one-phase current based on the corrected two-phase currents.

Note that the timing generator 44, the correction value calculator 45, and the correction unit 41b of the arm current calculator 41 serve as, for example, a corrector; the correction unit 41b carries out the correction task.

Figure 13A:
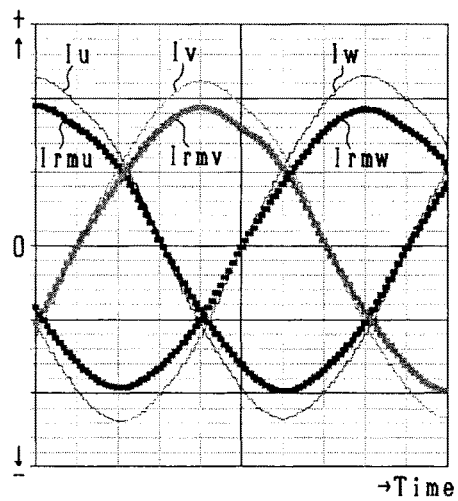
FIG. 13A is a graph schematically illustrating (1) How U-, V-, and W-phase currents detected by an arm current calculator and uncorrected thereby change over time (2) How actual U-, V-, and W-phase currents change over time FIG. 13B schematically illustrates (1) How corrected U-, V-, and W-phase currents, which have been corrected by the arm current calculator, change over time (2) How the actual U-, V-, and W-phase currents change over time
Figure 13B:
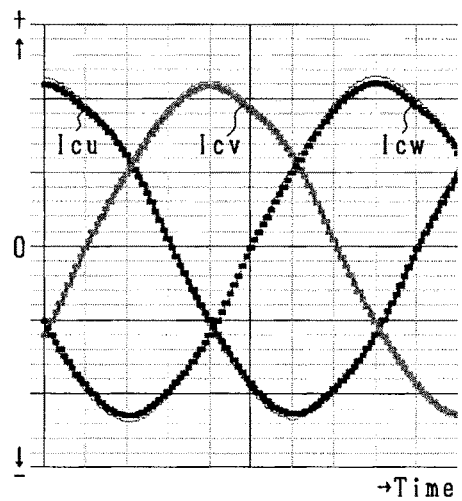

FIG. 13A schematically illustrates (1) How the U-, V-, and W-phase currents Irmu, Irmv, and Irmw, which are detected by the arm current calculator 41 and uncorrected thereby, change over time (2) How the actual U-, V-, and W-phase currents Iu, Iv, and Iw change over time In contrast, FIG. 13B schematically illustrates (1) How the corrected U-, V-, and W-phase currents Icu, Icv, and Icw, which have been corrected by the arm current calculator 41, change over time (2) How the actual U-, V-, and W-phase currents Iu, Iv, and Iw change over time FIGS. 13A and 13B show that correction of the U-, V-, and W-phase currents Irmu, Irmv, and Irmw enables the amplitudes of the currents Irmu, Irmv, and Irmw to be aligned with each other as illustrated by the corrected U-, V-, and W-phase currents Icu, Icv, and Icw. In addition, correction of each of the U-, V-, and W-phase currents Irmu, Irmv, and Irmw enables its offset error relative to the actual value of the corresponding phase current at the center of its variation to be reduced to substantially zero.

Figure 14:
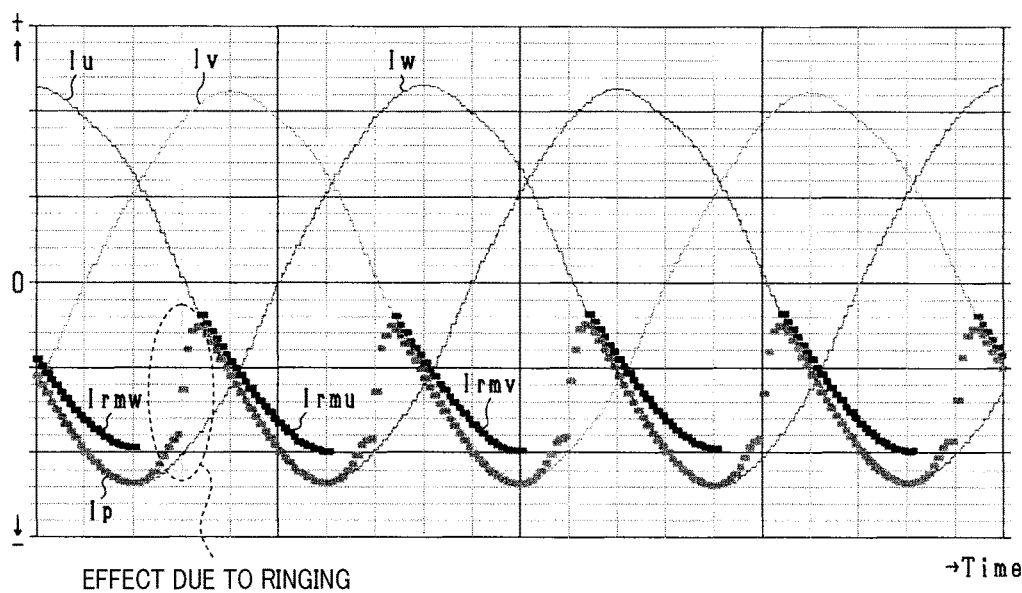
FIG. 14 is a graph schematically illustrating an adverse effect due to current ringing on busbars

FIG. 14 schematically illustrates (1) How the U-, V-, and W-phase currents Irmu, Irmv, and Irmw, which are detected by the arm current calculator 41 and uncorrected thereby, change over time (2) How the phase current Ip detected by the shunt current detector 43 changes over time FIG. 14 shows adverse effects due to ringing, which are included in the phase current Ip. The current detection apparatus 1 according to the first embodiment makes it possible to reduce the influence of the adverse effects due to the ringing on the correction accuracy of each phase current.

As described above, the timing generator 44 of the current detection apparatus 1 according to the first embodiment is configured to cyclically or periodically instruct, during the time for which the voltage vector of the inverter 21 is set to each of the second, fourth, and sixth voltage vectors V2, V4, and V6, (1) The shunt current detector 43 to detect a corrective phase current Ip (2) The current detection unit 41a to detect a corrective phase current ICrmu, ICrmv, or ICrmw synchronously or simultaneously with detection of the corrective phase current Ip For example, the timing generator 44 cyclically or periodically instructs, during the time for which the voltage vector of the inverter 21 is set to the second voltage vector V2, (1) The shunt current detector 43 to detect a first corrective w-phase current Ip (2) The current detection unit 41a to detect a second corrective w-phase current ICrmw synchronously or simultaneously with detection of the first corrective w-phase current Ip During the time for which the voltage vector of the inverter 21 is set to each of the second, fourth, and sixth voltage vectors V2, V4, and V6, a corresponding one of the corrective three-phase currents Ip and a corresponding one of the corrective three-phase currents ICrmu, ICrmv, and ICrmw both become the corresponding same-phase current flowing through the corresponding same-phase winding.

Then, the current correction unit 41b is configured to obtain (1) U-phase corrective current pairs including pairs of the corrective first U-phase current values detected by the shunt resistor 43 and the corrective second U-phase current values detected by the current detection unit 41a that are synchronized with the respective first U-phase current values (2) V-phase corrective current pairs including pairs of the corrective first V-phase current values detected by the shunt resistor 43 and the corrective second V-phase current values detected by the current detection unit 41a that are synchronized with the respective first V-phase current values (3) W-phase corrective current pairs including pairs of the corrective first W-phase current values detected by the shunt resistor 43 and the corrective second W-phase current values detected by the current detection unit 41a that are synchronized with the respective first W-phase current values Then, the current correction unit 41b is configured to correct at least two-phase currents detected by the current detection unit 41a in accordance with corresponding two of the U-, V-, and W-phase corrective current pairs, thus aligning the amplitudes of the at least two-phase currents with each other.

The above configuration of the current detection apparatus 1 enables the first corrective current for each phase detected by the shunt resistor 43 to be synchronized with the second corrective current for the corresponding phase detected by the current detection unit 41a of the arm current detector 41. This therefore results in the current detection apparatus 1 having higher correction accuracy of each phase current detected by the arm current detector 41.

Second Embodiment

Figure 15:
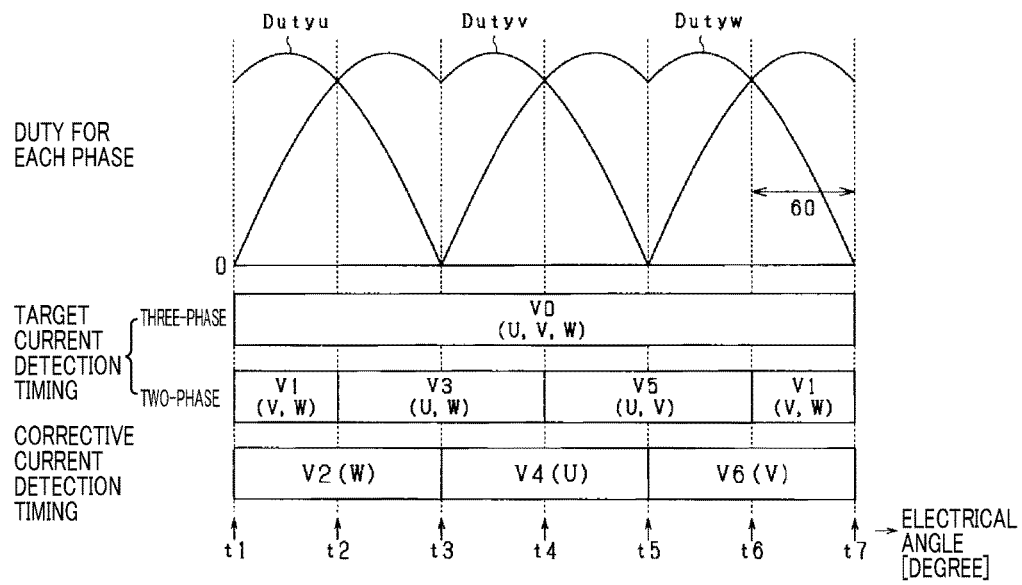
FIG. 15 is a timing chart schematically illustrating a first two-phase modulation task according to the second embodiment of the present disclosure.
Figure 16:
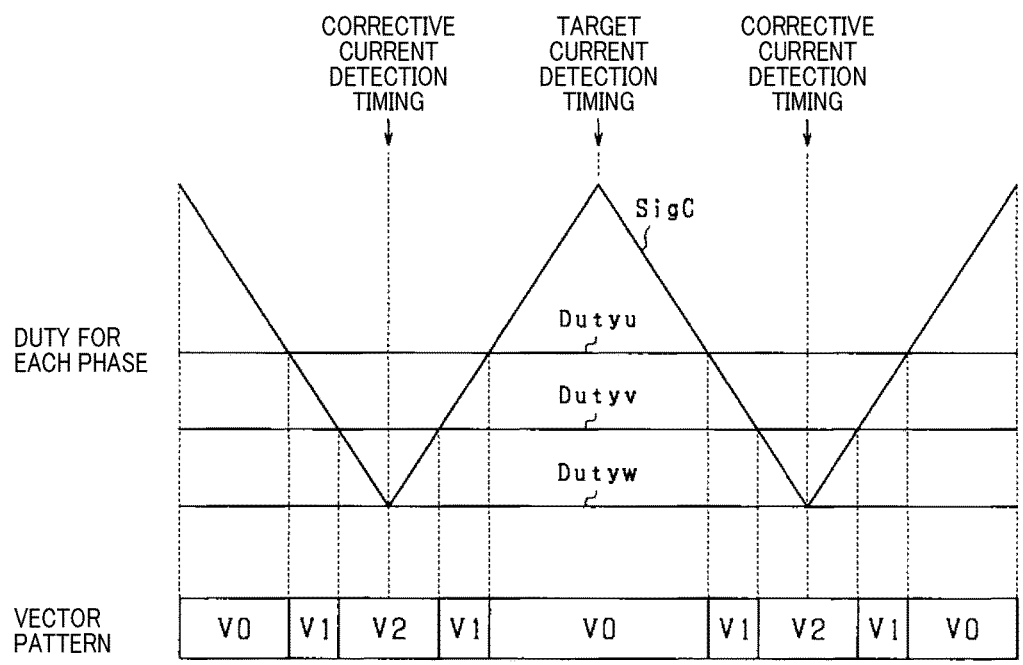
FIG. 16 is a timing chart schematically illustrating an example of detection timings of the corrective currents and a detection timing of a target phase current according to the second embodiment of the present disclosure.
Figure 17:
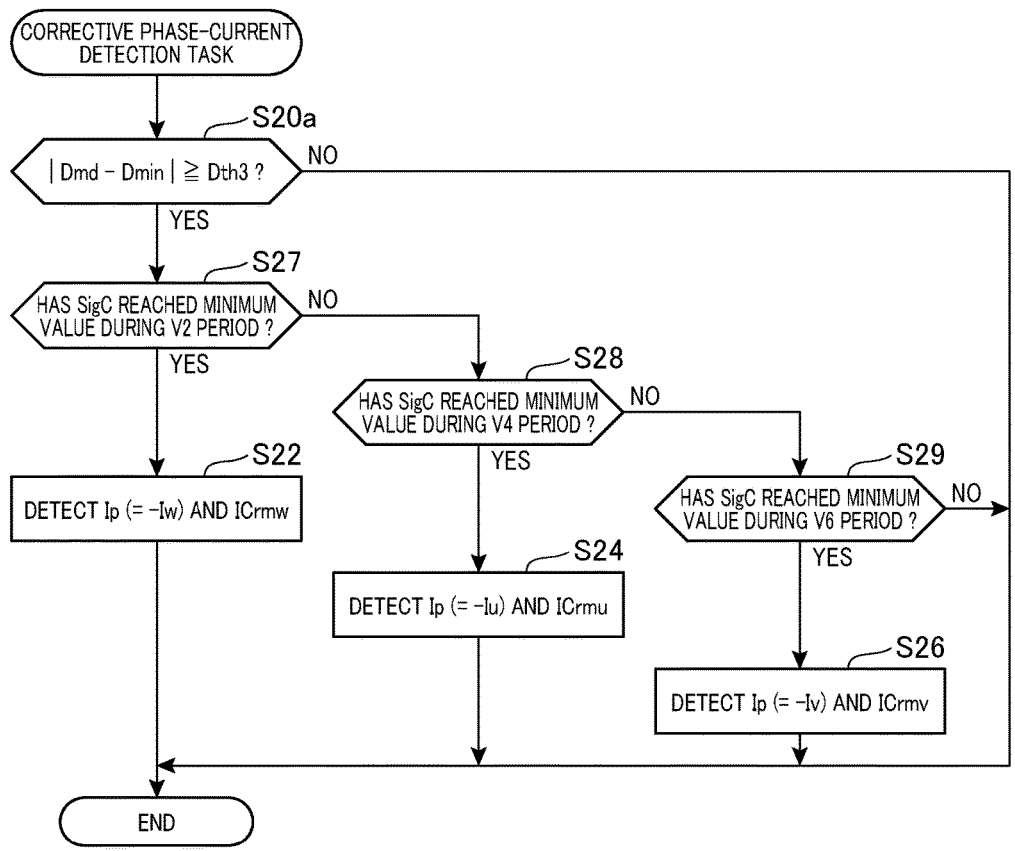
FIG. 17 is a flowchart schematically illustrating a corrective phase-current detection task according to the second embodiment.
Figure 18:
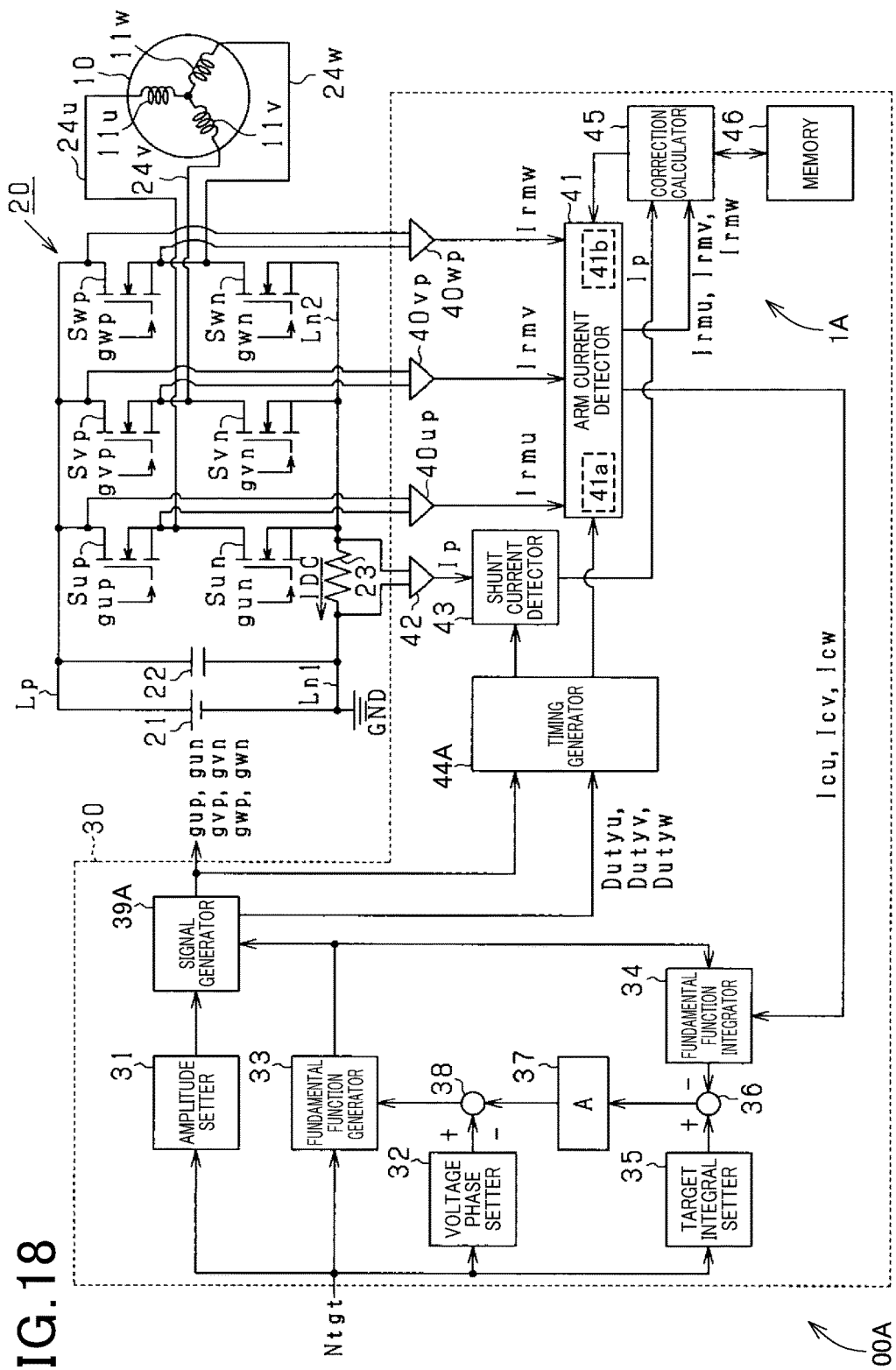
FIG. 18 is a circuit and block diagram schematically illustrating an example of the overall structure of a motor system according to the third embodiment of the present disclosure.

The following describes a motor system 100 according to the second embodiment of the present disclosure with reference to FIGS. 15 to 17. The structures and/or functions of the motor system 100 according to the second embodiment are different from those of the motor system 100 according to the first embodiment mainly by the following points. So, the following mainly describes the different points, and omits or simplifies descriptions of like parts between the first and second embodiments, to which identical or like reference characters are assigned, thus eliminating redundant descriptions.

The signal generator 39 of the rotation detecting apparatus 1 according to the second embodiment is configured to generate drive signals gup, gun, gyp, gvn, gwp, and gwn based on the voltage amplitude set by the amplitude setter 31 and the sinusoidal fundamental functions for the respective phases generated by the fundamental function generator 33 using known two-phase modulation.

That is, the signal generator 39 is configured to perform a first two-phase modulation task that calculates command duties Dutyu, Dutyv, and Dutyw such that (1) The upper-arm switch of a successively selected one of the three phases is fixed to off for every 120 electrical degrees of the motor 10

(2) The lower-arm switch of the successively selected one of the three-phases is fixed to on for every 120 electrical degrees of the motor 10

That is, for every 120 electrical degrees, two of the three-phase command duties Dutyu, Dutyv, and Dutyw based on the two-phase modulation are determined to enable a sinusoidal line-to-line voltage to be generated while the remaining phase command duty is fixed to the minimum value of zero.

FIG. 15 schematically illustrates, as an example, the waveform of each of the command duties Dutyu, Dutyv, and Dutyw during a predetermined period from time t1 to time t7, which will be referred to as the period (t1 to t7). Note that, within the period (t11 to t7), each timing to simultaneously detect the three-phase currents in one cycle Tc of the carrier signal SigC is determined to be identical to the corresponding same timing described in the first embodiment.

Specifically, for the 60 electrical-degree period from the time t1 to time t2, the U-phase command duty Dutyu becomes the maximum command duty, i.e. peak command duty, Dmax, the V-phase command duty Dvtyv becomes the middle command duty Dmd, and the W-phase command duty Dvtyw becomes the minimum command duty Dmin. This enables two-phase currents, i.e. V- and W-phase currents, to be simultaneously detected by the arm current detector 41 during the period of the first voltage vector V1.

In addition, for the 60 electrical-degree range from the time t1 to time t2, the timing at which a corrective phase current Ip and a corrective phase current ICrm, whose phases are identical to each other, are synchronously determinable is set within the period of the second voltage vector V2 (see FIG. 16).

That is, the timing generator 44 instructs, for the 60 electrical-degree range from the time t1 to time t2, (1) The shunt current detector 43 to detect, based on the output of the amplifier 42, a corrective phase current Ip as a negative W-phase current −Iw at the timing when the carrier signal SiC has reached its minimum value, i.e. lower peak, during the period of the second voltage vector V2

(2) The current detection unit 41a to detect the output signal of the W-phase lower-arm amplifier 40wn as a corrective W-phase current ICrmw at the timing when the carrier signal SiC has reached its minimum value, i.e. lower peak, during the period of the second voltage vector V2

This makes it possible to easily detect both the corrective phase current Ip and the corrective W-phase current ICrmw.

For the 60 electrical-degree range from the time t2 to time t3, the V-phase command duty Dutyv becomes the maximum command duty, i.e. peak command duty, Dmax, the U-phase command duty Dvtyu becomes the middle command duty Dmd, and the W-phase command duty Dvtyw becomes the minimum command duty Dmin. This enables two-phase currents, i.e. U- and W-phase currents, to be simultaneously detected by the arm current detector 41 during the period of the third voltage vector V3.

In addition, for the 60 electrical-degree range from the time t2 to the time t3, the timing at which a corrective phase current Ip and a corrective phase current ICrm, whose phases are identical to each other, are synchronously determinable is set within the period of the second voltage vector V2 (see FIG. 16), which is similar to the 60 electrical-degree range from the time t1 to the time t2.

For the 60 electrical-degree range from the time t3 to time t4, the V-phase command duty Dutyv becomes the maximum command duty, i.e. peak command duty, Dmax, the W-phase command duty Dvtyw becomes the middle command duty Dmd, and the U-phase command duty Dvtyu becomes the minimum command duty Dmin. This enables two-phase currents, i.e. U- and W-phase currents, to be simultaneously detected by the arm current detector 41 during the period of the third voltage vector V3, which is similar to the 60 electrical-degree range from the time t2 to the time t3.

In addition, for the 60 electrical-degree range from the time t3 to the time t4, the timing at which a corrective phase current Ip and a corrective phase current ICrm, whose phases are identical to each other, are synchronously determinable is set within the period of the fourth voltage vector V4.

For the 60 electrical-degree range from the time t4 to time t5, the W-phase command duty Dutyw becomes the maximum command duty, i.e. peak command duty, Dmax, the V-phase command duty Dvtyv becomes the middle command duty Dmd, and the U-phase command duty Dvtyu becomes the minimum command duty Dmin. This enables two-phase currents, i.e. U- and V-phase currents, to be simultaneously detected by the arm current detector 41 during the period of the fifth voltage vector V5.

In addition, for the 60 electrical-degree range from the time t4 to the time t5, the timing at which a corrective phase current Ip and a corrective phase current ICrm, whose phases are identical to each other, are synchronously determinable is set within the period of the second voltage vector V4, which is similar to the 60 electrical-degree range from the time t3 to the time t4.

For the 60 electrical-degree range from the time t5 to time t6, the W-phase command duty Dutyw becomes the maximum command duty, i.e. peak command duty, Dmax, the U-phase command duty Dvtyu becomes the middle command duty Dmd, and the V-phase command duty Dvtyv becomes the minimum command duty Dmin. This enables two-phase currents, i.e. U- and V-phase currents, to be simultaneously detected by the arm current detector 41 during the period of the fifth voltage vector V5, which is similar to the 60 electrical-degree range from the time t4 to the time t5.

In addition, for the 60 electrical-degree range from the time t5 to the time t6, the timing at which a corrective phase current Ip and a corrective phase current ICrm, whose phases are identical to each other, are synchronously determinable is set within the period of the sixth voltage vector V6.

For the 60 electrical-degree range from the time t6 to time t7, the U-phase command duty Dutyu becomes the maximum command duty, i.e. peak command duty, Dmax, the W-phase command duty Dvtyw becomes the middle command duty Dmd, and the V-phase command duty Dvtyv becomes the minimum command duty Dmin. This enables two-phase currents, i.e. V- and W-phase currents, to be simultaneously detected by the arm current detector 41 during the period of the first voltage vector V1.

In addition, for the 60 electrical-degree range from the time t6 to the time t7, the timing at which a corrective phase current Ip and a corrective phase current ICrm, whose phases are identical to each other, are synchronously determinable is set within the period of the sixth voltage vector V6, which is similar to the 60 electrical-degree range from the time t5 to the time t6.

Next, the following describes the corrective phase-current detection task, which is carried out by the timing generator 44 every predetermined period (see FIG. 17). Note that, in the corrective phase-current detection tasks illustrated in respective FIGS. 8 and 17, like operations between the corrective phase-current detection tasks illustrated in respective FIGS. 8 and 17, to which like step numbers are assigned, are omitted or simplified to avoid redundant description.

In step S20a, the timing generator 44 selects, from the U-, V-, W-phase command duties Dutyu, Dutyv, and Dutyw calculated by the signal generator 39, the middle one of the U-, V-, W-phase command duties Dutyu, Dutyv, and Dutyw as the middle command duty Dmd, and the lowest one of the U-, V-, W-phase command duties Dutyu, Dutyv, and Dutyw as the minimum command duty Dmin.

Next, the timing generator 44 calculates an absolute value of the difference of the minimum command duty Dmin from the middle command duty Dmd, and determines whether the calculated absolute value is equal to or larger than a third time threshold DTh3 in step S20a. This operation in step S20a aims to determine whether to simultaneously detect a phase current based on the voltage drop across the shunt resistor 23 and a phase current based on the drain-source voltage across the corresponding phase lower-arm switch. The third time threshold DTh3 can be set to be larger than the second time threshold DTh2 or preferably to double the second time threshold DTh2.

Upon determining that the calculated absolute value is equal to or larger than the third threshold DTh3 (YES in step S20a), the timing generator 44 determines whether the carrier signal SiC has reached its minimum value, i.e. zero, during the period of the voltage vector of the inverter 20 being set to the second voltage vector V2 in step S27. Upon determining that carrier signal SiC has reached its minimum value during the period of the voltage vector of the inverter 20 being set to the second voltage vector V2 (YES in step S27), the timing generator 44 instructs (1) The shunt current detector 43 to detect, based on the output of the amplifier 42, the corrective phase current Ip as a negative W-phase current –Iw (2) The current detection unit 41a to detect the output signal of the W-phase lower-arm amplifier 40wn as a corrective W-phase current ICrmw in step S22.

The respective units 43 and 41a store the detected corrective current values (Ip=–Iw) and ICrmw in the memory 46.

Otherwise, upon determining that the voltage vector of the inverter 20 is not set to the second voltage vector V2 or the carrier signal SiC has not reached its minimum value (NO in step S27), the timing generator 44 determines whether the carrier signal SiC has reached its minimum value during the period of the voltage vector of the inverter 20 being set to the fourth voltage vector V4 in step S28. Upon determining that the carrier signal SiC has reached its minimum value during the period of the voltage vector of the inverter 20 being set to the fourth voltage vector V4 (YES in step S28), the timing generator 44 instructs (1) The shunt current detector 43 to detect, based on the output of the amplifier 42, the corrective phase current Ip as a negative U-phase current –Iu (2) The current detection unit 41a to detect the output signal of the U-phase lower-arm amplifier 40un as a corrective U-phase current ICrmu in step S24.

The respective units 43 and 41a store the detected corrective current values (Ip=–Iu) and ICrmu in the memory 46.

Otherwise, upon determining that the voltage vector of the inverter 20 is not set to the second voltage vector V4 or the carrier signal SiC has not reached its minimum value (NO in step S28), the timing generator 44 determines whether the carrier signal SiC has reached its minimum value during the period of the voltage vector of the inverter 20 being set to the sixth voltage vector V6 in step S29. Upon determining that the carrier signal SiC has reached its minimum value during the period of the voltage vector of the inverter 20 being set to the sixth voltage vector V6t (YES in step S29), the timing generator 44 instructs (1) The shunt current detector 43 to detect, based on the output of the amplifier 42, the corrective phase current Ip as a negative V-phase current –Iv (2) The current detection unit 41a to detect the output signal of the V-phase lower-arm amplifier 40vn as a corrective V-phase current ICrmv in step S26

The respective units 43 and 41a store the detected corrective current values (Ip=–Iv) and ICrmv in the memory 46.

Otherwise, upon determining that the voltage vector of the inverter 20 is not set to the sixth voltage vector V6 or the carrier signal SiC has not reached its minimum value (NO in step S29), the timing generator 44 terminates the corrective phase-current detection task.

On the other hand, upon determining that the calculated absolute value is smaller than the second time threshold DTh2 (NO in step S20a), the timing generator 44 terminates the corrective phase-current detection task.

As described above, the current detection apparatus 1 according to the second embodiment enables the first corrective current, i.e. the phase current Ip, for each phase detected by the shunt resistor 43, to be synchronized with the second corrective current, i.e. the second corrective current value ICrmu, ICrmv, or ICrmw detected by the current detection unit 41a of the arm current detector 41. This therefore results in the current detection apparatus having higher correction accuracy of each phase current detected by the arm current detector 41 in the same manner as the current detection apparatus 1.

Third Embodiment

The following describes a motor system 100A according to the third embodiment of the present disclosure with reference to FIGS. 18 to 23. The structures and/or functions of the motor system 100A according to the third embodiment are different from those of the motor system 100 according to the second embodiment mainly by the following points. So, the following mainly describes the different points, and omits or simplifies descriptions of like parts between the second and third embodiments, to which identical or like reference characters are assigned, thus eliminating redundant descriptions.

A current detection apparatus 1A of the motor system 100A includes U-, V-, and W-phase upper-arm amplifiers 40up, 40vp, and 40wp in place of the U-, V-, and W-phase lower-arm amplifiers 40un, 40vn, and 40wn.

The U-, V-, and W-phase upper-arm amplifiers 40up, 40vp, and 40wp amplify and output the voltages between the sources and the drains of the respective U-, V-, and W-phase upper-arm switches Sup, Svp, and Swp.

An arm current detector 41A includes, for example, the current detection unit 41a and the current correction unit 41b. The current detection unit 41a detects the output signals of the upper-arm amplifiers 40up, 40vp, and 40wp as three phase currents at a current detection timing instructed by a timing generator 44A. Note that the upper-arm switches Sup, Svp, and Swp serve as, for example, detection switches according to the third embodiment.

Like the first embodiment, as illustrated in FIG. 19, one phase current in accordance with the voltage vector flows through the shunt resistor 23 in each period during which the voltage vector of the inverter 20 is a corresponding one of voltage vectors V1 to V6. One phase current in accordance with the voltage vector can be therefore detected on the basis of the voltage drop across the shunt resistor 23.

Figures 20, 21:
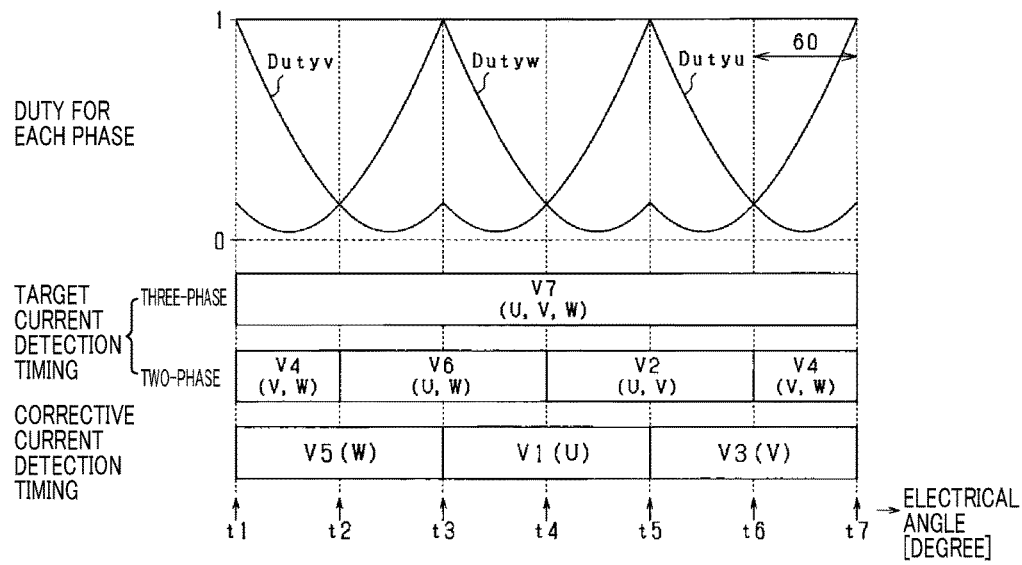
FIG. 20 is a timing chart schematically illustrating a second two-phase modulation task according to the third embodiment.
FIG. 21 is a timing chart schematically illustrating an example of detection timings of the corrective currents and a detection timing of a target phase current according to the third embodiment.

Referring to FIG. 20, a signal generator 39A is configured to generate drive signals gup, gun, gyp, gvn, gwp, and gwn based on the voltage amplitude set by the amplitude setter 31 and the sinusoidal fundamental functions for the respective phases generated by the fundamental function generator 33 using known two-phase modulation.

That is, the signal generator 39A is configured to perform a second two-phase modulation task that calculates command duties Dutyu, Dutyv, and Dutyw such that (1) The upper-arm switch of a successively selected one of the three phases is fixed to on for every 120 electrical degrees of the motor 10

(2) The lower-arm switch of the successively selected one of the three-phases is fixed to off for every 120 electrical degrees of the motor 10

That is, for every 120 electrical degrees, two of the three-phase command duties Dutyu, Dutyv, and Dutyw based on the two-phase modulation are determined to enable a sinusoidal line-to-line voltage to be generated while the remaining phase command duty is fixed to the maximum value of 1.

FIG. 20 schematically illustrates, as an example, the waveform of each of the command duties Dutyu, Dutyv, and Dutyw during a predetermined period from time t1 to time t7, which will be referred to as the period (t1 to t7). Note that, within the period (t11 to t7), each timing to simultaneously detect the three-phase currents in one cycle Tc of the carrier signal SigC is within the period of the seventh voltage vector V7.

Specifically, for the 60 electrical-degree period from the time t1 to time t2, the W-phase command duty Dutyw becomes the maximum command duty, i.e. peak command duty, Dmax, the V-phase command duty Dvtyv becomes the middle command duty Dmd, and the U-phase command duty Dvtyu becomes the minimum command duty Dmin. This enables two-phase currents, i.e. V- and W-phase currents, to be simultaneously detected by the arm current detector 41 during the period of the fourth voltage vector V4.

In addition, for the 60 electrical-degree range from the time t1 to time t2, the timing at which a corrective phase current Ip and a corrective phase current ICrm, whose phases are identical to each other, are synchronously determinable is set within the period of the fifth voltage vector V5 (see FIG. 20).

That is, the timing generator 44A instructs, for the 60 electrical-degree range from the time t1 to time t2, (1) The shunt current detector 43 to detect, based on the output of the amplifier 42, a corrective phase current Ip as a positive W-phase current Iw at the timing when the carrier signal SiC has reached its maximum value, i.e. higher peak, during the period of the fifth voltage vector V5

(2) The current detection unit 41a to detect the output signal of the W-phase upper-arm amplifier 40wp as a corrective W-phase current ICrmw at the timing when the carrier signal SiC has reached its maximum value, i.e. higher peak, during the period of the fifth voltage vector V5 This makes it possible to easily detect both the corrective phase current Ip and the corrective W-phase current ICrmw.

For the 60 electrical-degree range from the time t2 to time t3, the W-phase command duty Dutyw becomes the maximum command duty, i.e. peak command duty, Dmax, the U-phase command duty Dvtyu becomes the middle command duty Dmd, and the V-phase command duty Dvtyv becomes the minimum command duty Dmin. This enables two-phase currents, i.e. U- and W-phase currents, to be simultaneously detected by the arm current detector 41 during the period of the sixth voltage vector V6.

In addition, for the 60 electrical-degree range from the time t2 to the time t3, the timing at which a corrective phase current Ip and a corrective phase current ICrm, whose phases are identical to each other, are synchronously determinable is set within the period of the fifth voltage vector V5 (see FIG. 20), which is similar to the 60 electrical-degree range from the time t1 to the time t2.

For the 60 electrical-degree range from the time t3 to time t4, the U-phase command duty Dutyu becomes the maximum command duty, i.e. peak command duty, Dmax, the W-phase command duty Dvtyw becomes the middle command duty Dmd, and the V-phase command duty Dvtyv becomes the minimum command duty Dmin. This enables two-phase currents, i.e. U- and W-phase currents, to be simultaneously detected by the arm current detector 41 during the period of the sixth voltage vector V6, which is similar to the 60 electrical-degree range from the time t2 to the time t3.

In addition, for the 60 electrical-degree range from the time t3 to the time t4, the timing at which a corrective phase current Ip and a corrective phase current ICrm, whose phases are identical to each other, are synchronously determinable is set within the period of the first voltage vector V1.

For the 60 electrical-degree range from the time t4 to time t5, the U-phase command duty Dutyu becomes the maximum command duty, i.e. peak command duty, Dmax, the V-phase command duty Dvtyv becomes the middle command duty Dmd, and the W-phase command duty Dvtyw becomes the minimum command duty Dmin. This enables two-phase currents, i.e. U- and V-phase currents, to be simultaneously detected by the arm current detector 41 during the period of the second voltage vector V2.

In addition, for the 60 electrical-degree range from the time t4 to the time t5, the timing at which a corrective phase current Ip and a corrective phase current ICrm, whose phases are identical to each other, are synchronously determinable is set within the period of the first voltage vector V1, which is similar to the 60 electrical-degree range from the time t3 to the time t4. FIG. 21 schematically illustrates the timing at which the corrective phase current Ip and the corrective phase current ICrm, whose phases are identical to each other, are synchronously determinable is set within the period of the first voltage vector V1.

For the 60 electrical-degree range from the time t5 to time t6, the V-phase command duty Dutyv becomes the maximum command duty, i.e. peak command duty, Dmax, the U-phase command duty Dvtyu becomes the middle command duty Dmd, and the W-phase command duty Dvtyw becomes the minimum command duty Dmin. This enables two-phase currents, i.e. U- and V-phase currents, to be simultaneously detected by the arm current detector 41 during the period of the second voltage vector V2, which is similar to the 60 electrical-degree range from the time t4 to the time t5.

In addition, for the 60 electrical-degree range from the time t5 to the time t6, the timing at which a corrective phase current Ip and a corrective phase current ICrm, whose phases are identical to each other, are synchronously determinable is set within the period of the third voltage vector V3.

For the 60 electrical-degree range from the time t6 to time t7, the V-phase command duty Dutyv becomes the maximum command duty, i.e. peak command duty, Dmax, the W-phase command duty Dvtyw becomes the middle command duty Dmd, and the U-phase command duty Dvtyu becomes the minimum command duty Dmin. This enables two-phase currents, i.e. V- and W-phase currents, to be simultaneously detected by the arm current detector 41 during the period of the fourth voltage vector V4.

In addition, for the 60 electrical-degree range from the time t6 to the time t7, the timing at which a corrective phase current Ip and a corrective phase current ICrm, whose phases are identical to each other, are synchronously determinable is set within the period of the third voltage vector V3, which is similar to the 60 electrical-degree range from the time t5 to the time t6.

Figure 22:
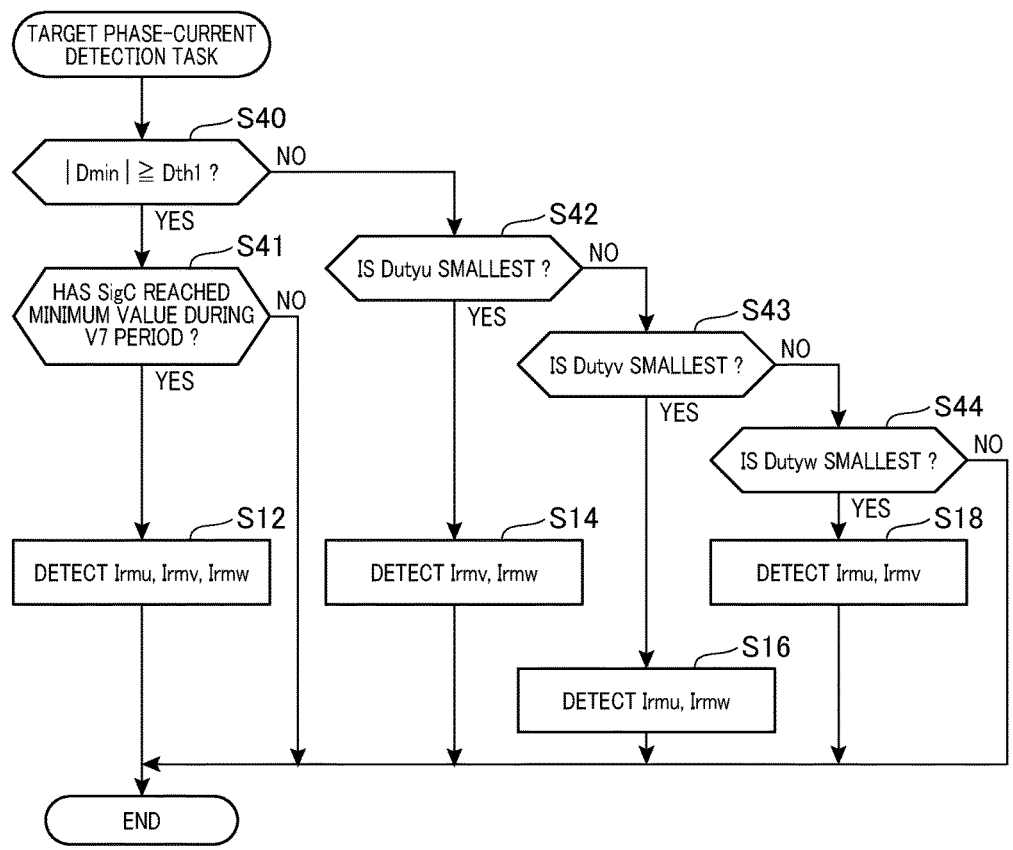
FIG. 22 is a flowchart schematically illustrating a control phase-current detection task according to the third embodiment.

Next, the following describes the target phase-current detection task, which is carried out by the timing generator 44A every predetermined period (see FIG. 22). Note that, in the target phase-current detection tasks illustrated in respective FIGS. 4 and 22, like operations between the corrective phase-current detection tasks illustrated in respective FIGS. 4 and 22, to which like step numbers are assigned, are omitted or simplified to avoid redundant description.

In step S40, the timing generator 44A selects, from the U-, V-, W-phase command duties Dutyu, Dutyv, and Dutyw calculated by the signal generator 39, one of the U-, V-, W-phase command duties Dutyu, Dutyv, and Dutyw, which is the lowest in them as a minimum command duty Dmin.

Next, the timing generator 44 calculates an absolute value of the minimum command duty Dmin, and determines whether the calculated absolute value is equal to or larger than the first time threshold DTh1 in step S40. This operation in step S40 aims to determine whether there is a possibility of deterioration in the detection accuracy of phase currents during the period of the seventh voltage vector V7 being set to the voltage vector of the inverter 20.

Upon determining that the calculated absolute value is equal to or larger than the first time threshold DTh1 (YES in step S40), the timing generator 44 determines that there are no possibilities of deterioration in the detection accuracy of phase currents during the period of the seventh voltage vector V7 being set to the voltage vector of the inverter 20. Then, the timing generator 44A determines whether the carrier signal SigC has reached a minimum value (MIN) of zero during the period of the seventh voltage vector V7 in step S41.

Upon determining that the carrier signal SigC has reached the minimum value (MIN) during the period of the seventh voltage vector V7 (YES in step S41), the timing generator 44 instructs the current detection unit 41a to detect the output signals of the respective U-, V- and W-phase upper-arm amplifiers 40up, 40vp, and 40wp as U-, V-, and W-phase currents Irmu, Irmv, and Irmw in step S12.

Otherwise, upon determining that the carrier signal SigC has not reached the minimum value (MIN) during the period of the seventh voltage vector V7 (NO in step S41), the timing generator 44A terminates the target phase-current detection task.

Upon determining that the calculated absolute value is smaller than the first time threshold DTh1 (NO in step S40), the timing generator 44A determines whether the U-phase command duty Dutyu is the smallest in the U-, V-, W-phase command duties Dutyu, Dutyv, and Dutyw in step S42. This operation in step S42 aims to determine whether it is time to detect two-phase currents, i.e. V- and W-phase currents.

Upon determining that the U-phase command duty Dutyu is the smallest in the U-, V-, W-phase command duties Dutyu, Dutyv, and Dutyw (YES in step S42), the timing generator 44 instructs the current detection unit 41a to detect the output signals of the respective V- and W-phase lower-arm amplifiers 40vn and 40wn as V- and W-phase currents Irmv and Irmw in step S14.

Otherwise, upon determining that the U-phase command duty Dutyu is not the smallest in the U-, V-, W-phase command duties Dutyu, Dutyv, and Dutyw (NO in step S42), the timing generator 44A determines whether the V-phase command duty Dutyv is the smallest in the U-, V-, W-phase command duties Dutyu, Dutyv, and Dutyw in step S43.

Upon determining that the V-phase command duty Dutyv is the smallest in the U-, V-, W-phase command duties Dutyu, Dutyv, and Dutyw (YES in step S43), the timing generator 44A instructs the current detection unit 41a to detect the output signals of the respective U- and W-phase lower-arm amplifiers 40un and 40wn as U- and W-phase currents Irmu and Irmw in step S16.

Otherwise, upon determining that the V-phase command duty Dutyv is not the smallest in the U-, V-, W-phase command duties Dutyu, Dutyv, and Dutyw (NO in step S43), the timing generator 44A determines whether the W-phase command duty Dutyw is the smallest in the U-, V-, W-phase command duties Dutyu, Dutyv, and Dutyw in step S44.

Upon determining that the W-phase command duty Dutyw is the smallest in the U-, V-, W-phase command duties Dutyu, Dutyv, and Dutyw (YES in step S43), the timing generator 44A instructs the current detection unit 41a to detect the output signals of the respective U- and V-phase lower-arm amplifiers 40*un* and 40*vn* as U- and V-phase currents Irmu and Irmv in step S18.

Otherwise, upon determining that the W-phase command duty Dutyw is not the smallest in the U-, V-, W-phase command duties Dutyu, Dutyv, and Dutyw (NO in step S43), the timing generator 44A terminates the target phase-current detection task.

Figure 23:
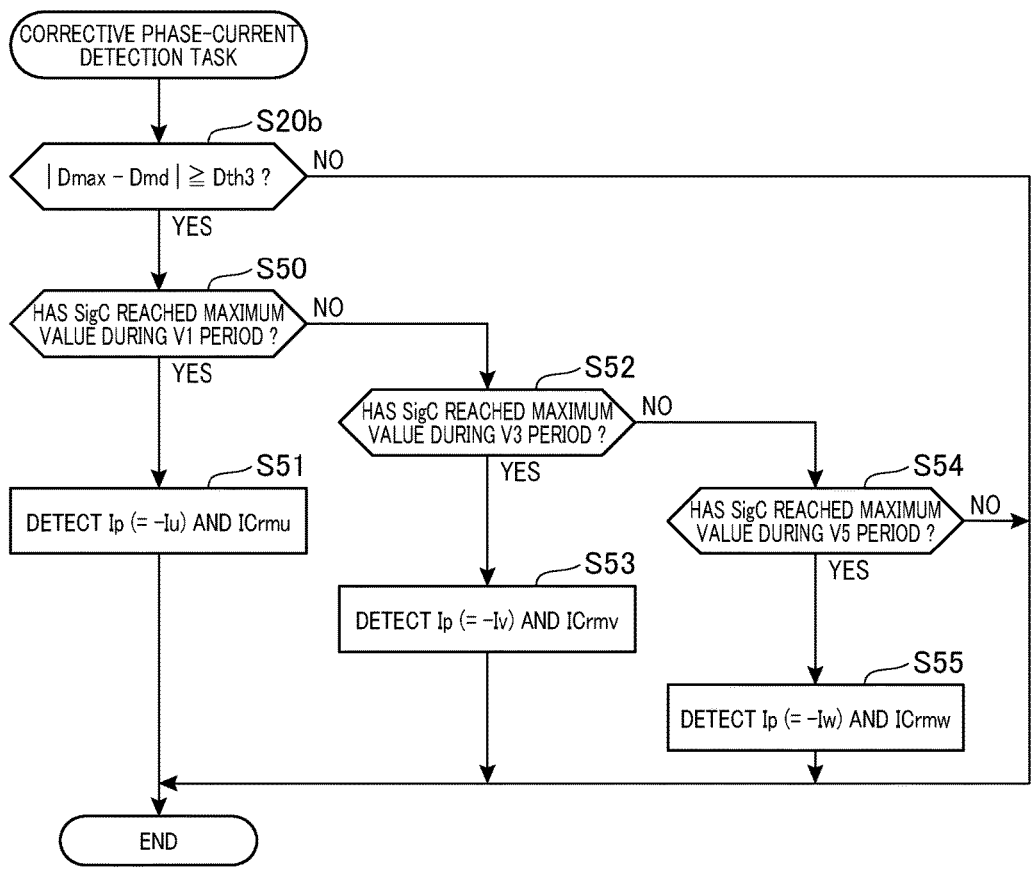
FIG. 23 is a flowchart schematically illustrating a corrective phase-current detection task according to the third embodiment.

Next, the following describes the corrective phase-current detection task, which is carried out by the timing generator 44A every predetermined period (see FIG. 23). Note that, in the corrective phase-current detection tasks illustrated in respective FIGS. 17 and 23, like operations between the corrective phase-current detection tasks illustrated in respective FIGS. 17 and 23, to which like step numbers are assigned, are omitted or simplified to avoid redundant description.

In step S20*b*, the timing generator 44A selects, from the U-, V-, W-phase command duties Dutyu, Dutyv, and Dutyw calculated by the signal generator 39A, the middle one of the U-, V-, W-phase command duties Dutyu, Dutyv, and Dutyw as the middle command duty Dmd, and the largest one of the U-, V-, W-phase command duties Dutyu, Dutyv, and Dutyw as the maximum command duty Dmax.

Next, the timing generator 44 calculates an absolute value of the difference of the middle command duty Dmd from the maximum command duty Dmax, and determines whether the calculated absolute value is equal to or larger than the third time threshold DTh3 in step S20*b*.

Upon determining that the calculated absolute value is equal to or larger than the third threshold DTh3 (YES in step S20*b*), the timing generator 44A determines whether the carrier signal SiC has reached its maximum value during the period of the voltage vector of the inverter 20 being set to the first voltage vector V1 in step S50. Upon determining that the carrier signal SiC has reached its maximum value during the period of the voltage vector of the inverter 20 being set to the first voltage vector V1 (YES in step S50), the timing generator 44A instructs (1) The shunt current detector 43 to detect, based on the output of the amplifier 42, the corrective phase current Ip as a positive U-phase current Iu (2) The current detection unit 41*a* to detect the output signal of the U-phase upper-arm amplifier 40*wp* as a corrective U-phase current ICrmu in step S51.

The respective units 43 and 41*a* store the detected corrective current values (Ip=Iu) and ICrmu in the memory 46.

Otherwise, upon determining that the voltage vector of the inverter 20 is not set to the first voltage vector V1 or the carrier signal SiC has not reached its maximum value (NO in step S50), the timing generator 44A determines whether the carrier signal SiC has reached its maximum value during the period of the voltage vector of the inverter 20 being set to the third voltage vector V3 in step S52. Upon determining that the carrier signal SiC has reached its maximum value during the period of the voltage vector of the inverter 20 being set to the third voltage vector V3 (YES in step S52), the timing generator 44 instructs (1) The shunt current detector 43 to detect, based on the output of the amplifier 42, the corrective phase current Ip as a positive V-phase current Iv (2) The current detection unit 41*a* to detect the output signal of the V-phase upper-arm amplifier 40*vp* as a corrective V-phase current ICrmv in step S53.

The respective units 43 and 41*a* store the detected corrective current values (Ip=Iv) and ICrmv in the memory 46.

Otherwise, upon determining that the voltage vector of the inverter 20 is not set to the third voltage vector V3 or the carrier signal SiC has not reached its maximum value (NO in step S52), the timing generator 44A determines whether the carrier signal SiC has reached its maximum value during the period of the voltage vector of the inverter 20 being set to the fifth voltage vector V5 in step S54. Upon determining that the carrier signal SiC has reached its maximum value during the period of the voltage vector of the inverter 20 being set to the fifth voltage vector V5 (YES in step S54), the timing generator 44A instructs (1) The shunt current detector 43 to detect, based on the output of the amplifier 42, the corrective phase current Ip as a positive W-phase current Iw (2) The current detection unit 41*a* to detect the output signal of the W-phase upper-arm amplifier 40*wp* as a corrective W-phase current ICrmw in step S55

The respective units 43 and 41*a* store the detected corrective current values (Ip=Iw) and ICrmw in the memory 46.

Otherwise, upon determining that the voltage vector of the inverter 20 is not set to the fifth voltage vector V5 or the carrier signal SiC has not reached its maximum value (NO in step S54), the timing generator 44A terminates the corrective phase-current detection task.

On the other hand, upon determining that the calculated absolute value is smaller than the third time threshold DTh3 (NO in step S20*b*), the timing generator 44A terminates the corrective phase-current detection task.

As described above, the current detection apparatus 1A according to the third embodiment enables the first corrective current, i.e. the phase current Ip, for each phase detected by the shunt resistor 43 to be synchronized with the second corrective current, i.e. the second corrective current value ICrmu, ICrmv, or ICrmw detected by the current detection unit 41*a* of the arm current detector 41. This therefore results in the current detection apparatus having higher correction accuracy of each phase current detected by the arm current detector 41 in the same manner as the current detection apparatus 1 according to the second embodiment.

Fourth Embodiment

Figure 24:
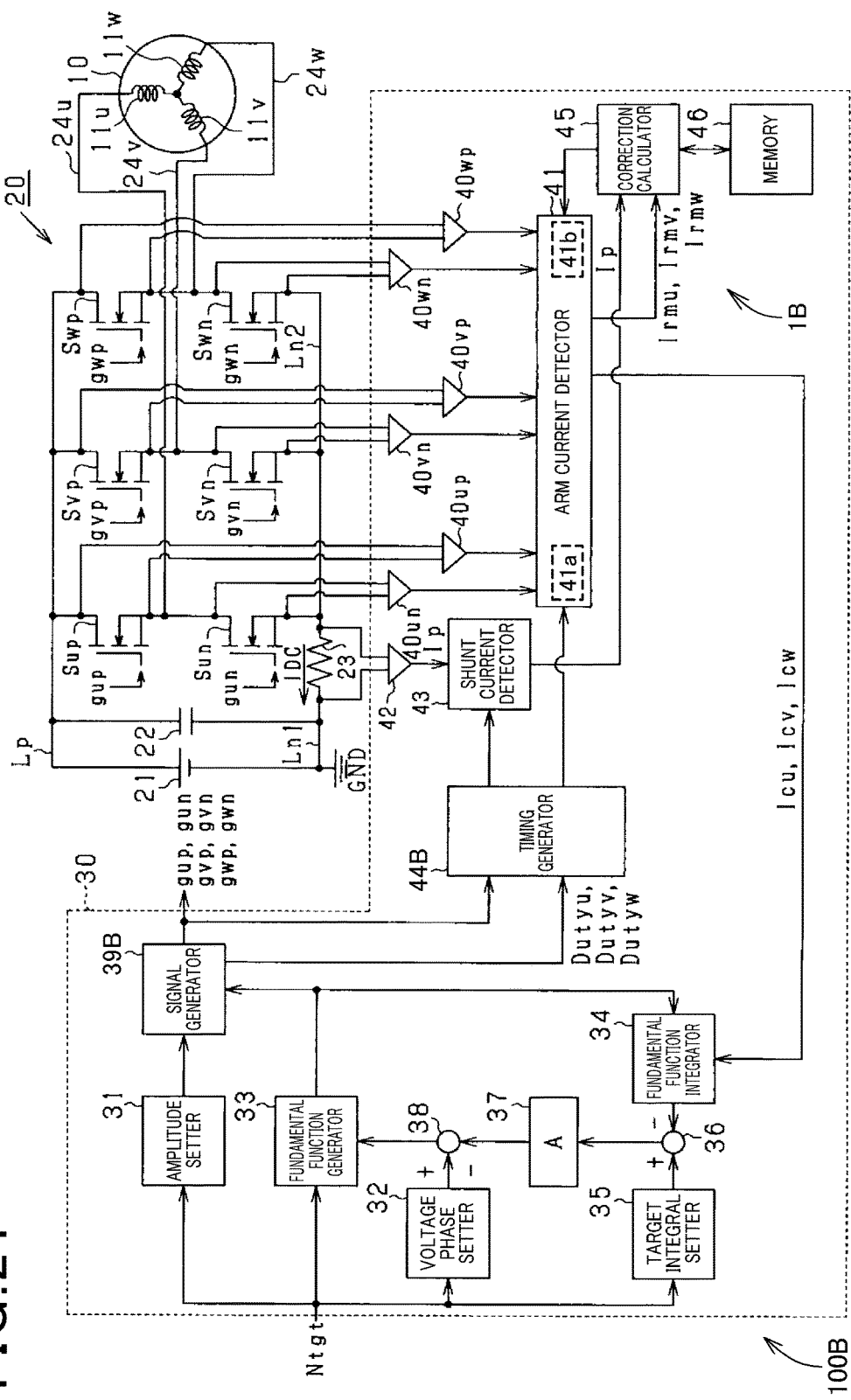
FIG. 24 is a circuit and block diagram schematically illustrating an example of the overall structure of a motor system according to the fourth embodiment of the present disclosure.
Figure 25:
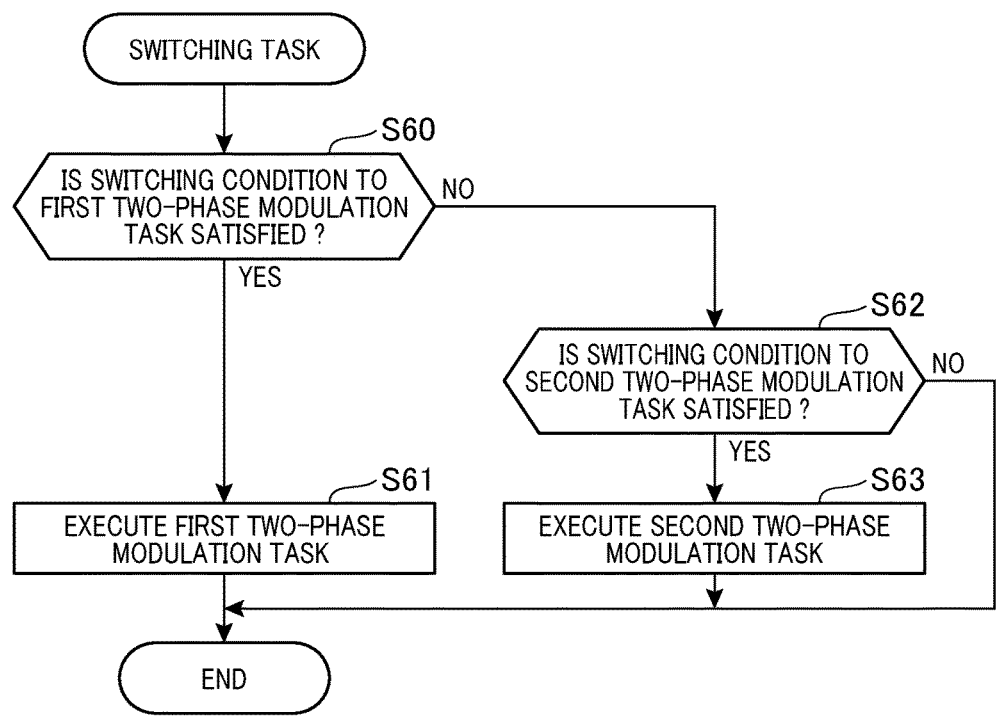
FIG. 25 is a flowchart schematically illustrating a two-phase modulation switching task, which is carried out by a signal generator every predetermined period according to the fourth embodiment.

The following describes a motor system 100B according to the fourth embodiment of the present disclosure with reference to FIGS. 24 and 25. The structures and/or functions of the motor system 100B according to the fourth embodiment are different from those of the motor systems 100 and 100A according to the second and third embodiments mainly by the following points. So, the following mainly describes the different points, and omits or simplifies descriptions of like parts between the second and third embodiments, to which identical or like reference characters are assigned, thus eliminating redundant descriptions.

A current detection apparatus 1B of the motor system 100B includes the U-, V-, and W-phase upper-arm amplifiers 40*up*, 40*vp*, and 40*wp* in addition place of the U-, V-, and W-phase lower-arm amplifiers 40*un*, 40*vn*, and 40*wn*.

The U-, V-, and W-phase upper-arm amplifiers 40*up*, 40*vp*, and 40*wp* amplify and output the voltages between the sources and the drains of the respective U-, V-, and W-phase upper-arm switches Sup, Svp, and Swp.

An arm current detector 41B includes, for example, the current detection unit 41*a* and a current correction unit 41*b*. The current detection unit 41*a* detects the output signals of the upper-arm amplifiers 40*up*, 40*vp*, and 40*wp*, or the output signals of the lower-arm amplifiers 40*un*, 40*vn*, and 40*wn* as three phase currents at a current detection timing instructed by a timing generator 44B.

A signal generator 30B of the control apparatus 30 is configured to selectively switches between the first two-phase modulation task according to the second embodiment and the second two-phase modulation task according to the third embodiment.

Next, the following describes a two-phase modulation switching task, which is carried out by the signal generator 30B every predetermined period (see FIG. 25).

In step S60, the signal generator 30B determines whether a switching condition to the first two-phase modulation task is satisfied in step S60. The switching condition to the first two-phase modulation task can be set to a condition that a predetermined time interval, such as a time interval equal to or more than one electrical angular phase, i.e. 360 electrical degrees, has elapsed since the start of the second two-phase modulation task. Note that, if the signal generator 30B starts the two-phase modulation switching task at the startup of the motor system 100B, the signal generator 30B is configured to start, for example, the first two-phase modulation task.

Upon determining that the switching condition to the first two-phase modulation task is satisfied (YES in step S60), the signal generator 30B executes the first two-phase modulation task using the lower-arm switches Sun, Svn, and Swn as illustrated in FIG. 15 in step S61. At that time, the current detection apparatus 1B executes the target phase-current detection task illustrated in FIG. 4, and the corrective phase-current detection task as illustrated in FIG. 17.

Otherwise, upon determining that the switching condition to the first two-phase modulation task is not satisfied (NO in step S60), the signal generator 30B determines whether a switching condition to the second two-phase modulation task is satisfied in step S62. The switching condition to the second two-phase modulation task can be set to a condition that a predetermined time interval, such as a time interval equal to or more than one electrical angular phase, i.e. 360 electrical degrees, has elapsed since the start of the first two-phase modulation task.

Upon determining that the switching condition to the second two-phase modulation task is satisfied (YES in step S62), the signal generator 30B executes the second two-phase modulation task using the upper-arm switches Sup, Svp, and Swp as illustrated in FIG. 20 in step S63. At that time, the current detection apparatus 1B executes the target phase-current detection task illustrated in FIG. 22, and the corrective phase-current detection task as illustrated in FIG. 23.

Otherwise, upon determining that the switching condition to the second two-phase modulation task is not satisfied (NO in step S62), the signal generator 30B terminates the two-phase modulation switching task.

As described above, the current detection apparatus 1B according to the fourth embodiment is configured to alternatively execute the first two-phase modulation task using the lower-arm switches Sun, Svn, and Swn, and the second two-phase modulation task using the upper-arm switches Sup, Svp, and Swp. This therefore prevents the lower-arm switches Sun, Svn, and Swn and the upper-arm switches Sup, Svp, and Swp from overheating in addition obtaining the benefits that are the same as the benefits of the second and third embodiments.

Fifth Embodiment

Figure 26:
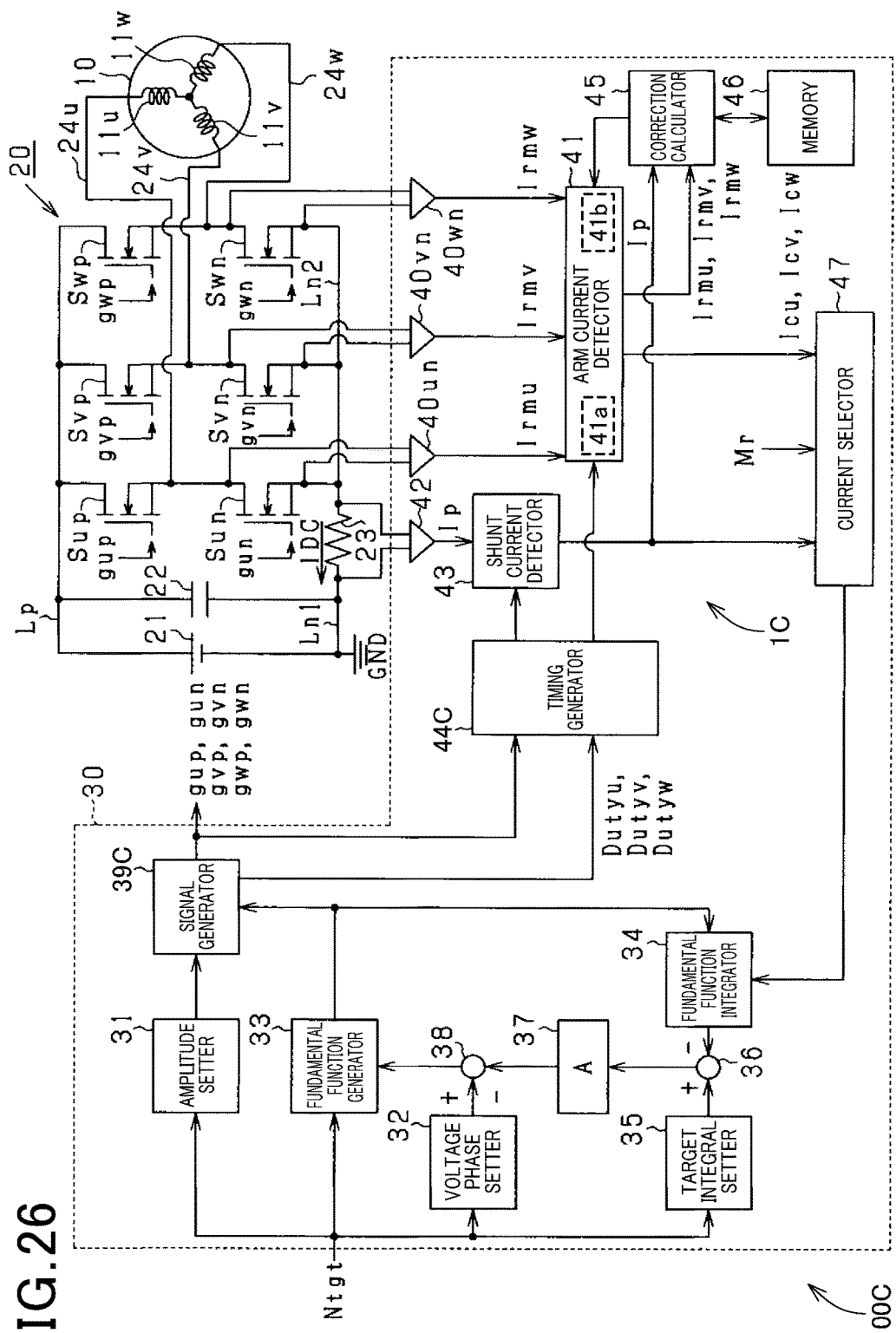
FIG. 26 is a circuit and block diagram schematically illustrating an example of the overall structure of a motor system according to the fifth embodiment of the present disclosure.

The following describes a motor system 100C according to the fifth embodiment of the present disclosure with reference to FIG. 26. The structures and/or functions of the motor system 100C according to the fifth embodiment are different from those of the motor system 100 according to the first embodiment mainly by the following points. So, the following mainly describes the different points, and omits or simplifies descriptions of like parts between the first and fifth embodiments, to which identical or like reference characters are assigned, thus eliminating redundant descriptions.

A current detection apparatus 1C of the motor system 100C includes a current selector 47.

That is, the current detection apparatus 1C is configured such that (1) The phase current Ip detected by the shunt resistor 43 is output to the current selector 47

(2) The corrected phase currents Icu, Icv, and Icw are output to the current selector 47

In addition, a timing generator 44C of the motor system 100C is configured not to execute the operation in step S10 in the control phase-current detection task illustrated in FIG. 4, and not to execute the operation in step S20 in the control phase-current detection task illustrated in FIG. 8. For this reason, the current detection apparatus 1C includes the current selector 47 for reducing adverse effects due to detection of phase currents during a ringing generation period.

The current selector 47 is configured to select, based on the modulation factor Mr, any one of the set of the corrected phase currents Icu, Icv, and Icw and the set of the sequentially detected three-phase currents Ip as target phase currents to be used for controlling the rotational speed of the motor 10.

Specifically, the current selector 47 is configured to (1) Determine whether the modulation factor Mr is located within a lower modulation factor range defined from, for example, 0 inclusive to a first reference value M1 exclusive (2) Select the set of the corrected phase currents Icu, Icv, and Icw to thereby output the set of the corrected phase currents Icu, Icv, and Icw to the fundamental function integrator 34

The first reference value M1 is set to a modulation factor by which the period of the voltage vector of the inverter 20 being set to one of the effective voltage vectors becomes equal to the fitter period Tsta; the filter period Tsta is required for ringing generated in a switched switch to have sufficiently decreased since a corresponding voltage vector switching timing. That is, the larger the modulation factor Mr is, the longer the period of the voltage vector of the inverter 20 being set to one of the effective voltage vectors.

The current selector 47 is also configured to (1) Determine whether the modulation factor Mr is located within a middle modulation factor range defined from, for example, the first reference value M1 inclusive to a second reference value M2 exclusive (2) Output, for each of the U-, V-, and W-phases, the corrected phase current output from the arm current detector 41 and the corresponding phase current detected by the shunt resistor 43 to the fundamental function integrator 34

The reason why the current selector 47 outputs, for each of the U-, V-, and W-phases, the corrected phase current output from the arm current detector 41 and the corresponding phase current detected by the shunt resistor 43 is that, even if noise due to the ringing is contained in any one of the corrected phase current output from the arm current detector 41 and the corresponding phase current detected by the shunt resistor 43, it is possible to reduce adverse effects due to the noise.

The second reference value M2 is set to a modulation factor by which the period of the voltage vector of the inverter 20 being set to the zeroth voltage vector V0 becomes equal to the fitter period Tsta. That is, the larger the modulation factor Mr is, the longer the period of the voltage vector of the inverter 20 being set to the zeroth voltage vector V0.

The current selector 47 is further configured to (1) Determine whether the modulation factor Mr is located within a higher modulation factor range defined to be equal to or higher than the second reference value M2

(2) Select the sequentially detected three-phase currents Ip, thus outputting them to the fundamental function integrator 34

As described above, the current detection apparatus 1C according to the fifth embodiment achieves the substantially identical effects achieved by the current detection apparatus 1 according to the first embodiment.

Sixth Embodiment

Figure 27:
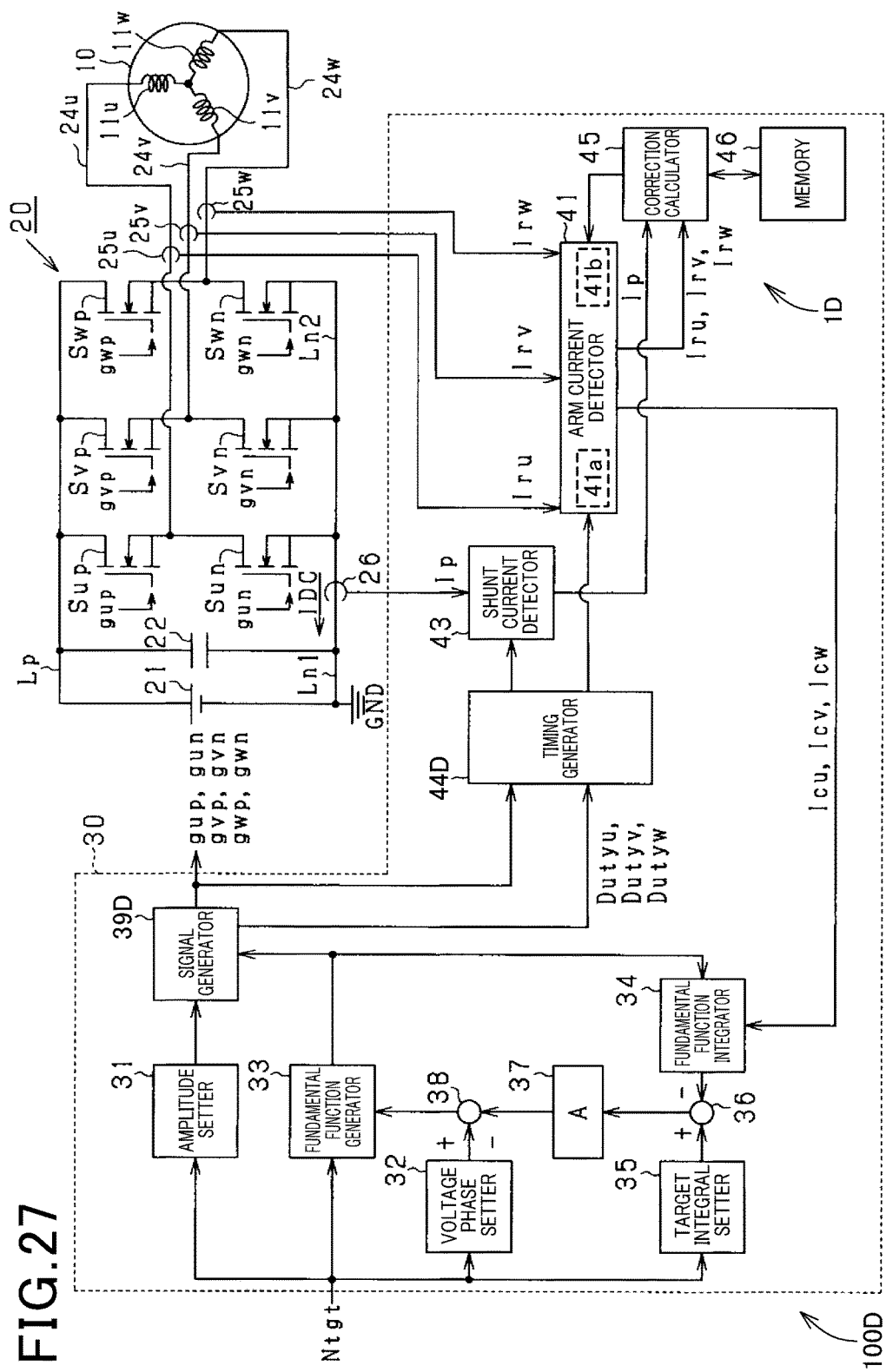
FIG. 27 is a circuit and block diagram schematically illustrating an example of the overall structure of a motor system according to the sixth embodiment of the present disclosure.
Figure 28:
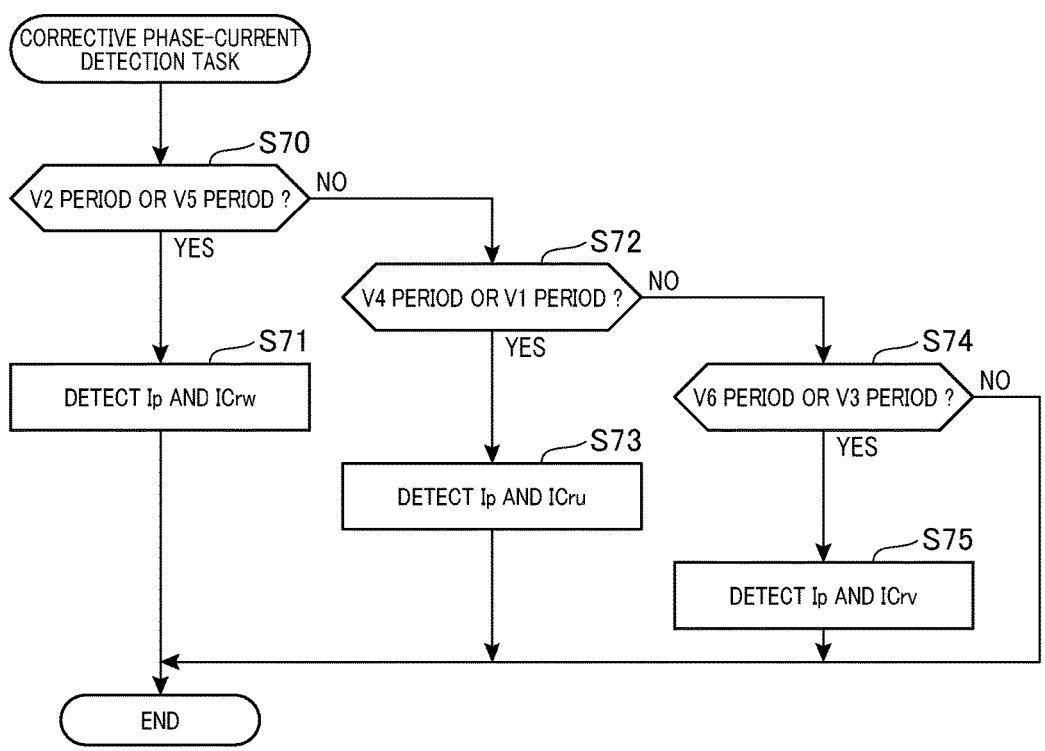
FIG. 28 is a flowchart schematically illustrating a corrective phase-current detection according to the sixth embodiment.

The following describes a motor system 100D according to the sixth embodiment of the present disclosure with reference to FIGS. 27 and 28. The structures and/or functions of the motor system 100D according to the sixth embodiment are different from those of the motor system 100 according to the first embodiment mainly by the following points. So, the following mainly describes the different points, and omits or simplifies descriptions of like parts between the first and sixth embodiments, to which identical or like reference characters are assigned, thus eliminating redundant descriptions.

The motor system 100D includes a U-phase current sensor 25U, a V-phase current sensor 25V, and a W-phase current sensor 25W. The U-phase current sensor 25U is operative to measure a U-phase current Iru flowing through the U-phase conductive member 24U. The V-phase current sensor 25V is operative to measure a V-phase current Irv flowing through the V-phase conductive member 24V. The W-phase current sensor 25W is operative to measure a W-phase current Irw flowing through the W-phase conductive member 24W. Each of the current sensors 25U to 25W is designed as, for example, a current transformer sensor.

The control system 100D also includes a bus current sensor 26 in place of the shunt resistor 23. Specifically, the first end of the first negative bus Ln1 is connected to the negative terminal of the battery 21, and the second end of the first negative bus Ln1, to which the negative electrode of the smoothing capacitor 22 is connected, is connected to the first end of the second negative bus Ln2. This enables the bus current sensor 26 to measure the bus current IDC flowing through the first and second negative buses Ln1 and Ln2, and output the bus current IDC to the bus current detector 43D.

The current detection unit 41a is configured to detect the three-phase currents Iru, Irv, and Irw output from the respective current sensors 25U, 25V, and 25W each time a current detection timing is instructed thereto by a timing generator 44D.

The current detection apparatus 1D includes a bus current detector 43D in place of the shunt current detector 43. The bus current detector 43D detects, as a corrective phase current Ip, the output of the bus current sensor 26 each time a detection timing is instructed thereto by the timing generator 44D.

That is, ringing due to the drain-source voltage across a switched lower-arm switch have little influence on the three-phase currents Iru, Irv, and Irw measured gy the respective current sensors 25U, 25V, and 25W. In addition, the current detection apparatus 1D is capable of sampling the three-phase currents Iru, Irv, and Irw at any timing independently of the inverter 20 being set to any of the voltage vectors. For this reason, the timing generator 44D is configured to cyclically instruct the bus current detector 43 about a detection timing of the output of the bus current sensor 26.

Next, the following describes the corrective phase-current detection task, which is carried out by the timing generator 44D every predetermined period (see FIG. 28).

In step S70, the timing generator 44D determines whether the voltage vector of the inverter 20 is set to any one of the second voltage vector V2 and the fifth voltage vector V5 in step S70. Upon determining that the voltage vector of the inverter 20 is set to any one of the second voltage vector V2 and the fifth voltage vector V5 (YES in step S70), the timing generator 44D instructs (1) The bus current detector 43D to detect the output of the bus current sensor 26 as a corrective phase current Ip as a positive or negative W-phase current −Iw or Iw (2) The current detection unit 41a to detect the output signal of the W-phase current sensor 25W as a corrective W-phase current ICrw in step S71.

The respective units 43D and 41a store the detected corrective current values (Ip=−Iw or Iw) and ICrw in the memory 46.

Otherwise, upon determining that the voltage vector of the inverter 20 is set to neither the second voltage vector V2 nor the fifth voltage vector V5 (NO in step S70), the timing generator 44D determines whether the voltage vector of the inverter 20 is set to any one of the fourth voltage vector V4 and the first voltage vector V1 in step S72. Upon determining that the voltage vector of the inverter 20 is set to any one of the fourth voltage vector V4 and the first voltage vector V1 (YES in step S72), the timing generator 44D instructs (1) The bus current detector 43D to detect the output of the bus current sensor 26 as a corrective phase current Ip as a positive or negative U-phase current −Iu or Iu (2) The current detection unit 41a to detect the output signal of the U-phase current sensor 25U as a corrective U-phase current ICru in step S73.

The respective units 43D and 41a store the detected corrective current values (Ip=−Iu or Iu) and ICru in the memory 46.

Otherwise, upon determining that the voltage vector of the inverter 20 is set to neither the fourth voltage vector V4 nor the first voltage vector V2 (NO in step S72), the timing generator 44 determines whether the voltage vector of the inverter 20 is set to any one of the sixth voltage vector V6 and the third voltage vector V3 in step S74. Upon determining that the voltage vector of the inverter 20 is set to any one of the sixth voltage vector V6 and the third voltage vector V3 (YES in step S74), the timing generator 44D instructs (1) The bus current detector 43D to detect the output of the bus current sensor 26 as a corrective phase current Ip as a positive or negative V-phase current −Iv or Iv (2) The current detection unit 41a to detect the output signal of the V-phase current sensor 25V as a corrective V-phase current ICrv in step S75.

The respective units 43D and 41a store the detected corrective current values (Ip=−Iv or Iv) and ICrv in the memory 46.

Otherwise, upon determining that the voltage vector of the inverter 20 is set to neither the sixth voltage vector V6 nor the third voltage vector V3 (NO in step S74), the timing generator 44D terminates the corrective phase-current detection task.

Note that the stored corrective currents in each of the steps S71, S73, and S75 are used by the correction value calculator 45 set forth above.

As described above, the current detection apparatus 1D according to the sixth embodiment makes it possible to increase the opportunity to detect corrective phase currents in addition to achieving the substantially identical effects achieved by the current detection apparatus 1 according to the first embodiment.

Seventh Embodiment

Figure 29:
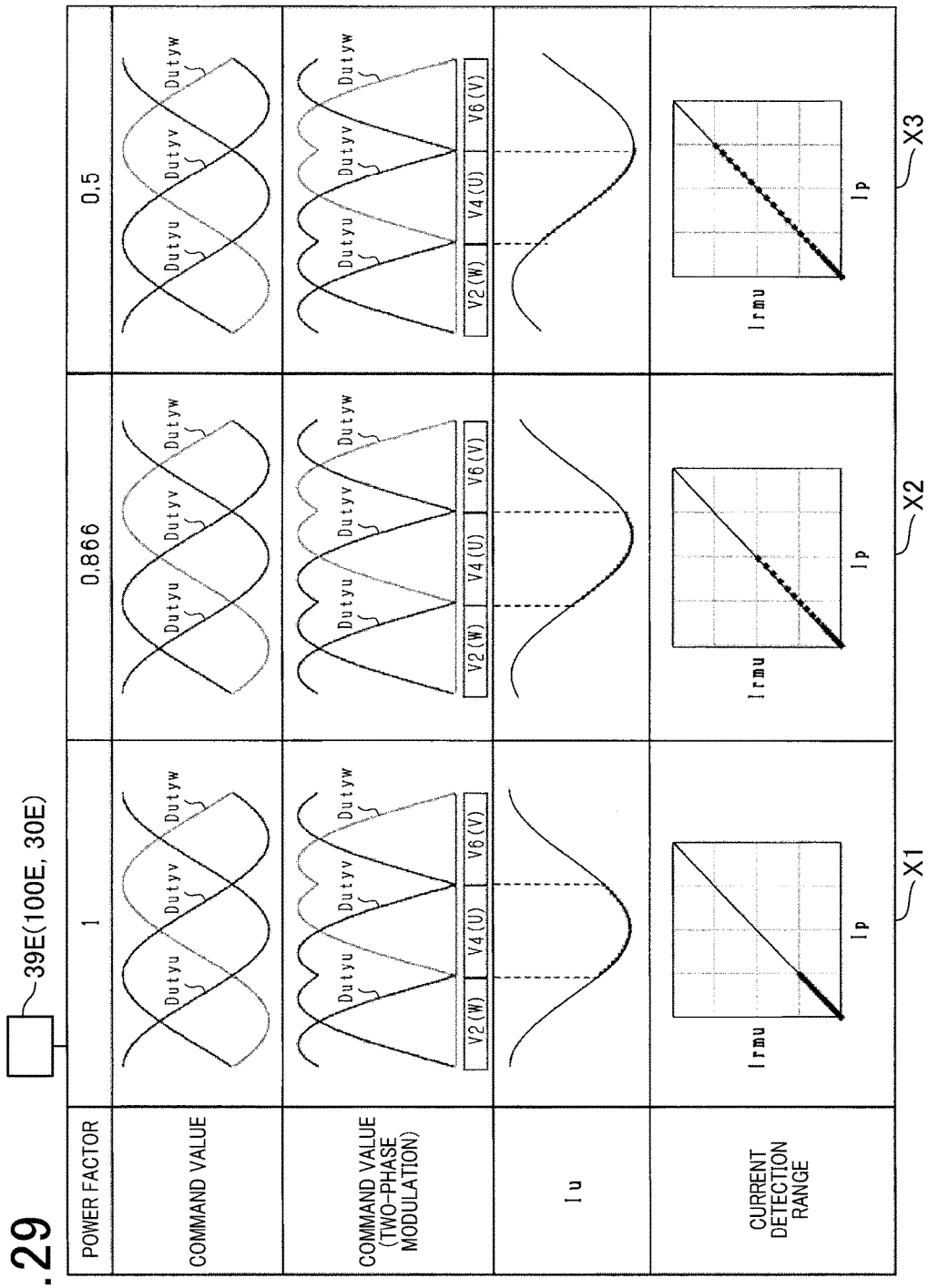
FIG. 29 is a view schematically illustrating an example of how to expand a corrective current detection range according to the seventh embodiment of the present disclosure.

The following describes a motor system 100E according to the seventh embodiment of the present disclosure with reference to FIG. 29. The structures and/or functions of the motor system 100E according to the seventh embodiment are different from those of the motor system 100 according to the first or second embodiment mainly by the following points. So, the following mainly describes the different points, and omits or simplifies descriptions of like parts between the first and seventh embodiments, to which identical or like reference characters are assigned, thus eliminating redundant descriptions.

As described above, the signal generator 39 of the control apparatus 30 is configured to determine on-off switching operations of each of the upper- and lower-arm switches Sup, Sun, Svp, Svn, Swp, and Swn in accordance with the commanded rotational speed Ntgt to thereby feedback control the rotational speed of the motor 10 to the commanded rotational speed Ntgt.

In contrast, in order to expand the current range detected by each of the arm current detector 41 and the shunt current detector 43, a signal generator 39E of a control apparatus 30E of the motor system 100E is specially configured to temporarily change the determined on-off switching operations of the upper- and lower-arm switches Sup, Sun, Svp, Svn, Swp, and Swn.

Specifically, referring to FIG. 29, the signal generator 39E temporarily changes the determined on-off switching operations of the upper- and lower-arm switches Sup, Sun, Svp, Svn, Swp, and Swn to thereby shift the phase of each phase current relative to the command duties Dutyu, Dutyv, and Dutyw, thus expanding a detection range of the corresponding phase current.

For example, FIG. 29 schematically illustrates that the signal generator 39E is configured to shift the phase of the U-phase current Iu relative to the command duties Dutyu, Dutyv, and Dutyw, thus expanding the detection range of the U-phase current Iu with a decrease in the power factor of the inverter 20; the power factor of the inverter 20 for the U-phase is determined based on the U-phase command duty Dutyu and the U-phase current Iu.

Specifically, reference character X1 of FIG. 29 schematically illustrates, when the power factor is set to 1, (1) How each of the command duties Dutyu, Dutyv, and Dutyw based on the three-phase modulation according to the first embodiment is changed over time (2) How each of the command duties Dutyu, Dutyv, and Dutyw and the voltage vector being set to the inverter 20 based on the two-phase modulation according to the second embodiment is changed over time (3) How the range of the U-phase current Iu corresponds to the fourth voltage vector V4 that is set for a U-phase current detection range (4) How the U-phase corrective current detection range is set for the first U-phase corrective current (Ip) and the second U-phase corrective current ICrmu In addition, reference character X2 of FIG. 29 schematically illustrates, when the power factor is set to 0.866, (1) How each of the command duties Dutyu, Dutyv, and Dutyw based on the three-phase modulation according to the first embodiment is changed over time (2) How each of the command duties Dutyu, Dutyv, and Dutyw and the voltage vector being set to the inverter 20 based on the two-phase modulation according to the second embodiment is changed over time (3) How the range of the U-phase current Iu corresponds to the fourth voltage vector V4 that is set for a U-phase current detection range (4) How the U-phase corrective current detection range is set for the first U-phase corrective current (Ip) and the second U-phase corrective current ICrmu Moreover, reference character X3 of FIG. 29 schematically illustrates, when the power factor is set to 0.5, (1) How each of the command duties Dutyu, Dutyv, and Dutyw based on the three-phase modulation according to the first embodiment is changed over time (2) How each of the command duties Dutyu, Dutyv, and Dutyw and the voltage vector being set to the inverter 20 based on the two-phase modulation according to the second embodiment is changed over time (3) How the range of the U-phase current Iu corresponds to the fourth voltage vector V4 that is set for a U-phase current detection range (4) How the U-phase corrective current detection range is set for the first U-phase corrective current (Ip) and the second U-phase corrective current ICrmu Note that how the voltage vector being set to the inverter 20 is changed over time based on the two-phase modulation illustrated in FIG. 29 corresponds to how the voltage vector being set to the inverter 20 is changed during the period from the time t1 to the time t7 illustrated in FIG. 15.

For example, the signal generator 39E is preferably perform temporal change of the determined on-off switching operations of the upper- and lower-arm switches Sup, Sun, Svp, Svn, Swp, and Swn every predetermined interval, such as one electrical angular phase, i.e. 360 electrical degrees.

As described above, the current detection apparatus 1E according to the seventh embodiment makes it possible to increase the detection accuracy of the three-phase correction gains au, av, and aw to thereby improve the correction accuracy of the three-phase currents Iu, Iv, and Iw.

Eighth Embodiment

Figure 30:
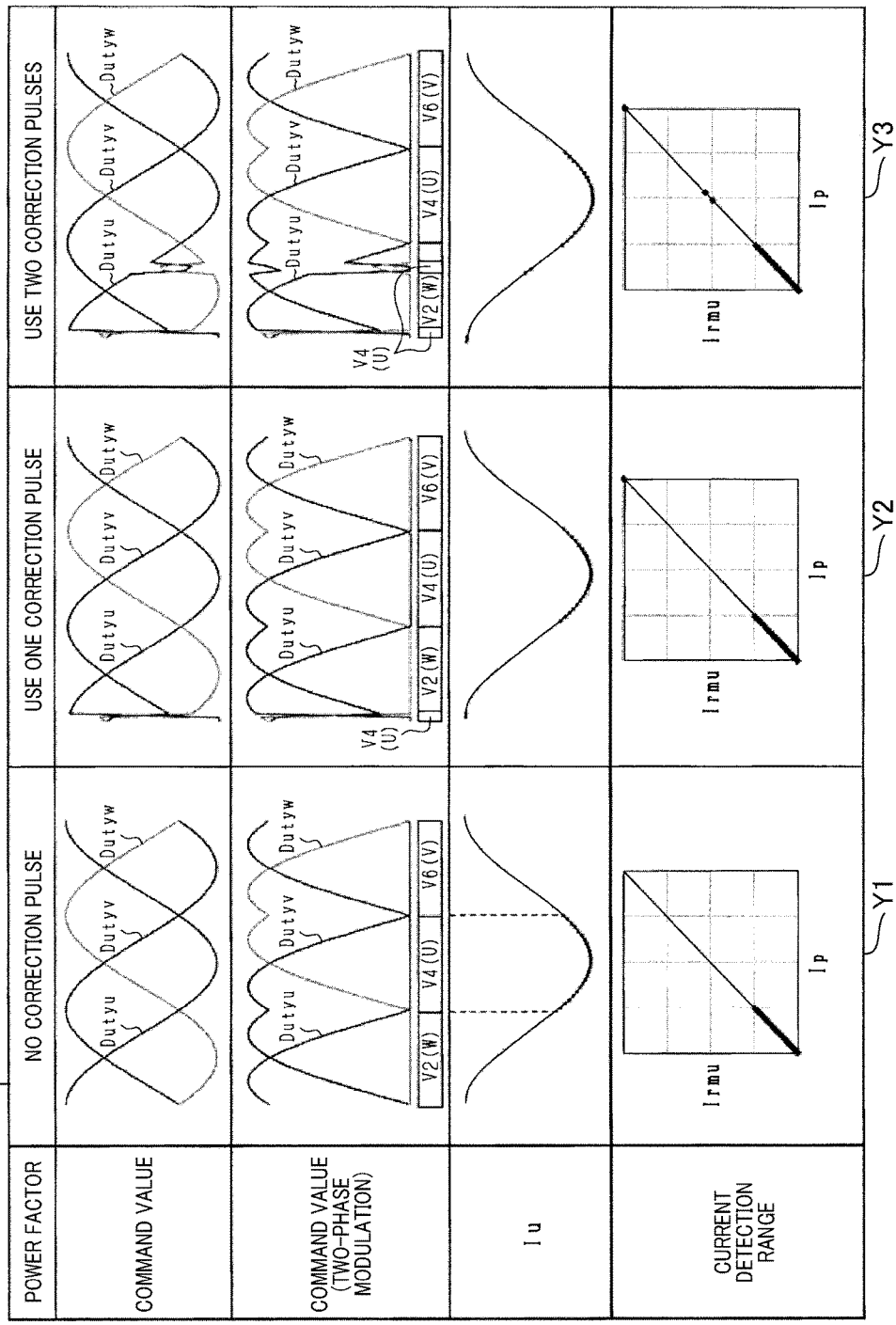
FIG. 30 is a view schematically illustrating an example of how to expand a corrective current detection range according to the eighth embodiment of the present disclosure.

The following describes a motor system 100F according to the eighth embodiment of the present disclosure with reference to FIG. 30. The structures and/or functions of the motor system 100F according to the eighth embodiment are different from those of the motor system 100E according to the seventh embodiment mainly by the following points. So, the following mainly describes the different points, and omits or simplifies descriptions of like parts between the seventh and eighth embodiments, to which identical or like reference characters are assigned, thus eliminating redundant descriptions.

As described above, the signal generator 39 of the control apparatus 30 is configured to determine on-off switching operations of each of the upper- and lower-arm switches Sup, Sun, Svp, Svn, Swp, and Swn in accordance with the commanded rotational speed Ntgt to thereby feedback control the rotational speed of the motor 10 to the commanded rotational speed Ntgt.

In contrast, in order to expand the current range detected by each of the arm current detector 41 and the shunt current detector 43, a signal generator 39F of a control apparatus 30F of the motor system 100F is specially configured to temporarily change the determined on-off switching operations of the upper- and lower-arm switches Sup, Sun, Svp, Svn, Swp, and Swn in the different approach from the above approach described in the seventh embodiment.

Specifically, the signal generator 39F temporarily change the determined on-off switching operations of the upper- and lower-arm switches Sup, Sun, Svp, Svn, Swp, and Swn to thereby temporarily change one of the effective voltage vectors required to feedback control the rotational speed of the motor 10 to the commanded rotational speed Ntgt to another effective voltage vector.

For example, the signal generator 39F is configured to superimpose at least one correction pulse on the command duties Dutyu, Dutyv, and Dutyw to thereby temporarily change one of the effective voltage vectors required to feedback control the rotational speed of the motor 10 to the commanded rotational speed Ntgt to another effective voltage vector.

Note that how the voltage vector being set to the inverter 20 is changed over time based on the two-phase modulation illustrated in FIG. 30 corresponds to how the voltage vector being set to the inverter 20 is changed during the period from the time t1 to the time t7 illustrated in FIG. 15.

Specifically, it is defined that a no-correction pulse case where no correction pulses are superimposed on the command duties Dutyu, Dutyv, and Dutyw during the period of the second voltage vector V2 as the U-phase voltage detection range.

In the no-correction pulse case, reference character Y1 of FIG. 30 schematically illustrates (1) How each of the command duties Dutyu, Dutyv, and Dutyw based on the three-phase modulation according to the first embodiment is changed over time (2) How each of the command duties Dutyu, Dutyv, and Dutyw and the voltage vector being set to the inverter 20 based on the two-phase modulation according to the second embodiment is changed over time (3) How the range of the U-phase current Iu corresponds to the fourth voltage vector V4 that is set for a U-phase current detection range (4) How the U-phase corrective current detection range is set for the first U-phase corrective current (Ip) and the second U-phase corrective current ICrmu In addition, it is defined a first correction pulse superimposition case where one correction pulse is superimposed on the command duties Dutyu, Dutyv, and Dutyw during the period of the second voltage vector V2 as the U-phase voltage detection range to thereby cause the fourth voltage vector V4 to appear once in the second voltage vector V2. In the one correction pulse superimposition case, reference character Y2 of FIG. 30 schematically illustrates (1) How each of the command duties Dutyu, Dutyv, and Dutyw based on the three-phase modulation according to the first embodiment is changed over time (2) How each of the command duties Dutyu, Dutyv, and Dutyw and the voltage vector being set to the inverter 20 based on the two-phase modulation according to the second embodiment is changed over time (3) How the range of the U-phase current Iu corresponds to the fourth voltage vector V4 that is set for a U-phase current detection range (4) How the U-phase corrective current detection range is set for the first U-phase corrective current (Ip) and the second U-phase corrective current ICrmu This results in a longer U-phase corrective current detection range in the one correction pulse superimposition case than the U-phase corrective current detection range in the no correction pulse superimposition case.

Moreover, a two correction pulse superimposition case is defined where two correction pulses are superimposed on the command duties Dutyu, Dutyv, and Dutyw during the period of the second voltage vector V2 as the U-phase voltage detection range to thereby cause the fourth voltage vector V4 to appear two times in the second voltage vector V2. In the two correction pulse superimposition case, reference character Y3 of FIG. 30 schematically illustrates (1) How each of the command duties Dutyu, Dutyv, and Dutyw based on the three-phase modulation according to the first embodiment is changed over time (2) How each of the command duties Dutyu, Dutyv, and Dutyw and the voltage vector being set to the inverter 20 based on the two-phase modulation according to the second embodiment is changed over time (3) How the range of the U-phase current Iu corresponds to the fourth voltage vector V4 that is set for a U-phase current detection range (4) How the U-phase corrective current detection range is set for the first U-phase corrective current (Ip) and the second U-phase corrective current ICrmu This results in a further longer U-phase corrective current detection range in the two correction pulse superimposition case than the U-phase corrective current detection range in the no correction pulse superimposition case.

As described above, the current detection apparatus 1F according to the eighth embodiment makes it possible to increase the detection accuracy of the three-phase correction gains au, av, and aw to thereby improve the correction accuracy of the three-phase currents Iu, Iv, and Iw, which is similar to the current detection apparatus 1E of the seventh embodiment.

Ninth Embodiment

Figure 31:
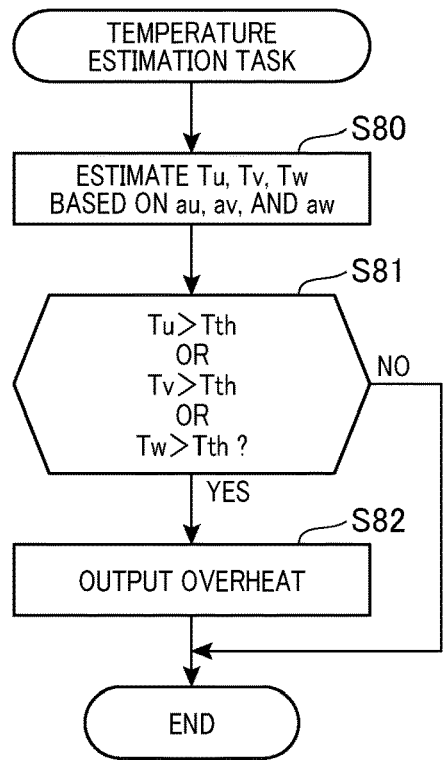
FIG. 31 is a flowchart schematically illustrating a temperature estimation task according to the ninth embodiment of the present disclosure.

The following describes a motor system according to the ninth embodiment of the present disclosure with reference to FIG. 31. The structures and/or functions of the motor system according to the ninth embodiment are different from those of the motor system 100 according to the first embodiment mainly by the following points. So, the following mainly describes the different points, and omits or simplifies descriptions of like parts between the first and ninth embodiments, to which identical or like reference characters are assigned, thus eliminating redundant descriptions.

The correction value calculator 45 according to the ninth embodiment includes a temperature estimator 45a configured to estimate the temperature of each of the lower-arm switches Sun, Svn, and Swn in accordance with the corresponding one of the correction gains au, av, and aw.

As illustrated by a phantom line in FIG. 1, the temperature estimator 45a has previously measured map information MI where values of the temperatures Tu, Tv, and Tw of the respective lower-arm switches Sun, Svn, and Swn are correlated with the corresponding values of the respective correction gains au, av, and aw.

Next, the following describes a temperature estimation task, which is carried out by the correction value calculator 45 every predetermined period (see FIG. 31).

In step S80, the correction value calculator 45 refers to the map information MI using the calculated correction gains au, av, and aw to thereby extract, from the map information MI, values of the temperatures Tu, Tv, and Tw respectively corresponding to the calculated correction gains au, av, and aw.

That is, an increase of a lower-arm switch causes the voltage across the input and output terminals of the lower-arm switch to increase, resulting in change of the correction gain calculated based on the voltage across the input and output terminals of the lower-arm switch. For this reason, the correction gain for a lower-arm switch has a correlation with the temperature of the lower-arm switch. This correlation enables the temperature of the lower-arm switch to be estimated based on the correction gain for the lower-arm switch. Note that the operation in step S80 of the correction value calculator 45 serves as, for example, the temperature estimator 45a.

In step S81, the correction value calculator 45 determines whether a logical OR of the following first to third conditions is true or false:

The first condition is that the estimated value of the temperature Tu of the U-phase lower-arm switch Sun exceeds a threshold temperature Tth The second condition is that the estimated value of the temperature Tv of the V-phase lower-arm switch Svn exceeds the threshold temperature Tth The third condition is that the estimated value of the temperature Tw of the W-phase lower-arm switch Swn exceeds the threshold temperature Tth Upon determining that the logical OR is false, i.e. all the first to third conditions are false (NO in step S81), the correction value calculator 45 terminates the temperature estimation task.

Otherwise, upon determining that the logical OR is true, i.e. at least one of the first to third conditions is true (YES in step S81), the correction value calculator 45 causes a warning unit WU (see a phantom line in FIG. 1) to audibly and/or visibly output, to a user of the motor system 100, such as the driver of the vehicle, a warning representing that at least one lower-arm switch, whose temperature value exceeds the threshold temperature, is overheated in step S82.

As described above, the current detection apparatus 1G according to the ninth embodiment makes it possible to monitor the temperature of each of the lower-arm switches Sun, Svn, and Swn without including temperature sensors in addition to achieving the substantially identical effects achieved by the current detection apparatus 1 according to the first embodiment.

Tenth Embodiment

The following describes a motor system according to the tenth embodiment of the present disclosure with reference to FIG. 8. The structures and/or functions of the motor system according to the tenth embodiment are different from those of the motor system 100 according to the first embodiment mainly by the following points. So, the following mainly describes the different points, and omits or simplifies descriptions of like parts between the first and ninth embodiments, to which identical or like reference characters are assigned, thus eliminating redundant descriptions.

Upon determining that the voltage vector of the inverter 20 is set to the second voltage vector V2 (YES in step S21), the timing generator 44 determines that a current detected by the arm current detector 41 and a current detected by the shunt current detector 43 are the same phase current, i.e. the W-phase current, flowing through the same-phase winding, i.e. the W-phase winding.

Then, the timing generator 44 instructs, for a predetermined reference period Lα since the affirmative timing, which will be referred to as a current detection timing, both the shunt current detector 43 and the current detection unit 41a to respectively (1) Detect, based on the output of the amplifier 42, the corrective phase current Ip as a negative W-phase current −Iw (2) Detect the output signal of the W-phase arm amplifier 40wn as a corrective W-phase current ICrmw simultaneously with detection of the corrective phase current Ip in step S22

The reference period Lα is taken for the on resistance of the corresponding lower-arm switch due to an increase of the temperature of the corresponding lower-arm switch based on the flow of the corrective W-phase current ICmw has increased since its initial value at the current detection timing up to 10% of the initial value assuming that a possible maximum current flows through the corresponding lower-arm switch.

Similarly, upon determining that the voltage vector of the inverter 20 is set to the second voltage vector V4 (YES in step S23), the timing generator 44 determines that a current detected by the arm current detector 41 and a current detected by the shunt current detector 43 are the same phase current, i.e. the U-phase current, flowing through the same-phase winding, i.e. the U-phase winding. Then, the timing generator 44 instructs, for the predetermined reference period Lα since the affirmative timing (current detection timing), both the shunt current detector 43 and the current detection unit 41a to respectively (1) Detect, based on the output of the amplifier 42, the corrective phase current Ip as a negative U-phase current −Iu (2) Detect the output signal of the U-phase arm amplifier 40un as a corrective U-phase current ICrmu simultaneously with detection of the corrective phase current Ip in step S24

In addition, upon determining that the voltage vector of the inverter 20 is set to the second voltage vector V6 (YES in step S25), the timing generator 44 determines that a current detected by the arm current detector 41 and a current detected by the shunt current detector 43 are the same phase current, i.e. the V-phase current, flowing through the same-phase winding, i.e. the V-phase winding. Then, the timing generator 44 instructs, for the predetermined reference period Lα since the affirmative timing (current detection timing), both the shunt current detector 43 and the current detection unit 41a to respectively (1) Detect, based on the output of the amplifier 42, the corrective phase current Ip as a negative V-phase current −Iv (2) Detect the output signal of the V-phase arm amplifier 40vn as a corrective V-phase current ICrmv simultaneously with detection of the corrective phase current Ip in step S26

As described above, the current detection apparatus according to the tenth embodiment makes it possible to reduce the temperature dependency of the three-phase correction gains au, av, and aw, thus improving the correction accuracy of the three-phase currents Iu, Iv, and Iw in addition to achieving the substantially identical effects achieved by the current detection apparatus 1 according to the first embodiment.

Eleventh Embodiment

Figure 32:
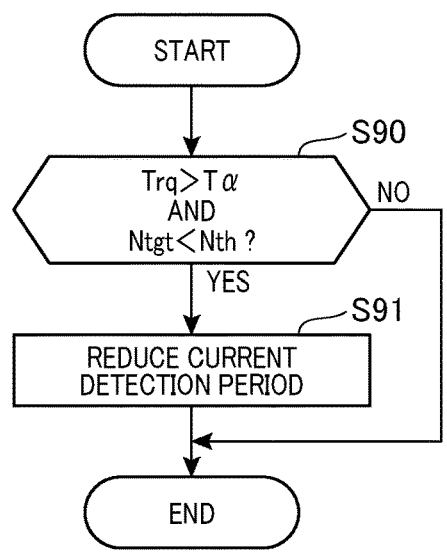
FIG. 32 is a flowchart schematically illustrating a current detection period reduction task according to the eleventh embodiment of the present disclosure.

The following describes a motor system according to the eleventh embodiment of the present disclosure with reference to FIG. 32. The structures and/or functions of the motor system according to the eleventh embodiment are different from those of the motor system according to the tenth embodiment mainly by the following points. So, the following mainly describes the different points, and omits or simplifies descriptions of like parts between the first and ninth embodiments, to which identical or like reference characters are assigned, thus eliminating redundant descriptions.

The timing generator 44 is configured to (1) Determine whether the period during which a current detected by the arm current detector 41 and a current detected by the shunt current detector 43 are the same phase current flowing through the same-phase winding has exceeded the predetermined reference period Lα

(2) Reduce a current detection period during which the same phase current is detected by both the arm current detector 41 and the shunt current detector 43 upon determining that the period during which a current detected by the arm current detector 41 and a current detected by the shunt current detector 43 are the same phase current flowing through the same-phase winding has exceeded the predetermined reference period Lα

Next, the following describes a current detection period reduction task, which is carried out by the timing generator 44 every predetermined period (see FIG. 32).

In step S90, the timing generator 44 determines whether output torque Tr of the motor 10 has exceeded a predetermined torque threshold Tα and the commanded rotational speed Ntgt is lower than a predetermined speed threshold Nth. This operation in step S90 aims to determine whether the period during which a current detected by the arm current detector 41 and a current detected by the shunt current detector 43 are the same phase current flowing through the same-phase winding has exceeded the predetermined reference period Lα.

That is, the lower the rotational speed of the motor 10 is, the longer the time required for the motor 10 to rotate by an electrical angular range is. This may increase time during which a current flowing through each lower-arm switch, resulting in an increase of heat generated by the corresponding lower-arm switch. In addition, the larger the output torque Tr of the motor 10 is, the larger a current flowing through each lower-arm switch is, resulting in an increase of heat generated by the corresponding lower-arm switch.

This increase of heat generated by each lower-arm switch may cause the on resistance of the lower-arm switch to increase, resulting in the period during which a current detected by the arm current detector 41 and a current detected by the shunt current detector 43 are the same phase current flowing through the same-phase winding has exceeded the predetermined reference period Lα.

For the above reason, the situation where the determination in step S90 is affirmative shows that the period during which a current detected by the arm current detector 41 and a current detected by the shunt current detector 43 are the same phase current flowing through the same-phase winding has likely exceeded the predetermined reference period Lα. Note that the timing generator 44 is capable of calculating the output torque Tr of the motor 10 as a function of the corrected phase currents Icu, Icv, and Icw. In step S90, the timing generator 44 can be configured to determine whether the amplitude of a current vector calculated based on the corrected phase currents Icu, Icv, and Icw has exceeded a predetermined amplitude threshold Tα in place of determining whether the output torque Tr of the motor 10 has exceeded the predetermined torque threshold Tα.

Upon determining that the output torque Tr of the motor 10 has exceeded the predetermined torque threshold Tα and the commanded rotational speed Ntgt is lower than the predetermined speed threshold Nth (YES in step S90), the timing generator 44 reduces the current detection period during which the same phase current is detected by both the arm current detector 41 and the shunt current detector 43 in each of steps S22, S24, and S26 (see step S91). Otherwise, upon determining that the output torque Tr of the motor 10 has not exceeded the predetermined torque threshold Tα or the commanded rotational speed Ntgt is equal to or higher than the predetermined speed threshold Nth (NO in step S90), the timing generator 44 terminates the current detection period reduction task.

That is, the operation in step S91 prevents both the shunt current detector 43 and the current detection unit 41a from respectively detecting the respective corrective same-phase currents after lapse of the reference period Lα since the affirmative determination in step S21, S23, or S25.

In step S91, the timing generator 44 can be configured to prevent the correction value calculator 45 from using the pairs of corrective phase currents detected by the respective detectors 43 and 41a, which are detected after the lapse of the reference period Lα since the affirmative determination in step S21, S23, or S25.

As described above, the current detection apparatus according to the eleventh embodiment makes it possible to prevent reduction in the correction accuracy of the three-phase currents Iu, Iv, and Iw due to change in the temperature of each lower-arm switch in addition to achieving the substantially identical effects achieved by the current detection apparatus 1 according to the first embodiment.

Modifications

The above embodiments can be modified as described below.

The current correction unit 41b according to each embodiment is configured to correct at least two-phase currents detected by the current detection unit 41a in accordance with corresponding two of the U-, V-, and W-phase corrective current pairs, thus aligning the amplitudes of the at least two-phase currents with each other. The present disclosure is however not limited to this configuration.

Rightfully, the current correction unit 41b can be configured to correct three-phase currents detected by the current detection unit 41a in accordance with the corresponding respective U-, V-, and W-phase corrective current pairs, thus aligning the amplitudes of the three-phase currents with each other.

In step S10 of FIG. 4, the timing generator 44 can be configured to use a maximum value of the modulation factor Mr in place of the maximum command duty Dmax In FIG. 10, the correction value calculator 45 can be configured not to calculate the three-phase offset correction values bu, by, and bw.

The shunt resistor 23 or bus current sensor 26 can be provided for the positive bus Lp in place of the first negative bus Ln1. Specifically, the shunt resistor 23 or bus current sensor 26 can be provided between the first connection point on the positive bus Lp and the second connection point on the positive bus Lp; the first connection point is a connection point between the positive bus Lp and the closet upper-arm switch to the battery 21, i.e. the switch Sup, and the second connection point is a connection point between the positive bus Lp and the smoothing capacitor 22.

Each switch constituting the inverter 20 is not limited to a MOSFET, but can be comprised of, for example, an insulated-gate bipolar transistor (IGBT). If each switch is comprised of an IGBT, each switch includes a flywheel diode or flyback diode connected in anti-parallel to the IGBT.

Moreover, each switch constituting the inverter 20 is not limited to a voltage-controlled switching element, but can be comprised of, for example, a current-controlled switching element, such as a bipolar transistor.

The controlled variable of the motor 10 is not limited to the rotational speed. Torque or another parameter can be used as the controlled variable of the motor 10.

The motor 10 can be configured such that the second ends of the U-, V-, and W-phase windings are connected in delta-configuration (Δ-configuration). Moreover, the motor 10 is not limited to three phase motors, but can be designed as multiphase motors other than three-phase motors. Furthermore, the motor 10 is not limited to the one used to drive vehicle-mounted auxiliary devices, but can be used vehicle-mounted main engines serving as a power source for generating running power of a vehicle. In addition, the motor 10 is not limited to a permanent magnet synchronous motor, but can be designed as, for example, a wound-field synchronous motor or synchronous reluctance motor. In addition, the motor 10 is not limited to a synchronous motor, but can be designed as another rotary electric machine, such as an induction rotary electric machine.

While the illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A current detection apparatus applicable to a system including an inverter including plural pairs of series-connected upper-arm switches and lower-arm switches, and a multi-phase rotary electric machine including multiphase windings, the upper- and lower-arm switches of each pair being connected to a corresponding phase winding of the multi-phase rotary electric machine, an upper set of the upper-arm switches being connected to a direct-current power supply via a first bus, a lower set of the lower-arm switches being connected to the direct-current power supply via a second bus, the current detection apparatus comprising:
   a first current detector configured to repeatedly detect at least:
      a corrective first phase current flowing through a corresponding first phase winding of the multiphase windings to thereby obtain plural values of the corrective first phase current; and
      a corrective second phase current flowing through a corresponding second phase winding of the multi-phase windings to thereby obtain plural values of the corrective second phase current;
   a second current detector configured to repeatedly detect at least:
      a corrective first phase bus-based current flowing through one of the first and second buses to thereby obtain plural values of the corrective first phase bus-based current, the corrective first phase bus-based current having the same phase as the phase of the corrective first phase current, the plural values of the corrective first phase bus-based current being synchronized with the respective plural values of the corrective first phase current; and
      a corrective second phase bus-based current flowing through one of the first and second buses to thereby obtain plural values of the corrective second phase bus-based current, the corrective second phase bus-based current having the same phase as the phase of the corrective second phase current, the plural values of the corrective second phase bus-based current being synchronized with the respective plural values of the corrective second phase current; and
   a corrector configured to:
      obtain:
         first current-value pairs of the plural values of the corrective first phase current and the respective plural values of the corrective first phase bus-based current; and
         second current-value pairs of the plural values of the corrective second phase current and the respective plural values of the corrective second phase bus-based current; and
      correct at least target first and second phase currents detected by the first current detector based on the obtained first current-value pairs and the second current-value pairs to thereby align amplitudes of the respective target first and second phase currents detected by the first current detector with each other.

2. The current detection apparatus according to claim 1, wherein:
   first and second phase switches selected in one of the upper set of the upper-arm switches and the lower set of the lower-arm switches are respectively defined as first and second detection switches;
   the first current detector is configured to repeatedly detect at least:
      the corrective first phase current based on a potential difference between input and output terminals of the first detection switch while only the first detection switch is on in the first and second detection switches; and
      the corrective second phase current based on a potential difference between input and output terminals of the second detection switch while only the second detection switch is on in the first and second detection switches;
   the second current detector configured to repeatedly detect at least:
      the corrective first phase bus-based current flowing through one of the first and second buses while only the first detection switch is on in the first and second detection switches; and
      the corrective second phase bus-based current flowing through one of the first and second buses while only the second detection switch is on in the first and second detection switches; and
   the corrector is configured to obtain:
      the first current-value pairs of the plural values of the corrective first phase current and the respective plural values of the corrective first phase bus-based current while the plural values of the corrective first phase bus-based current are synchronously detected with the respective plural values of the corrective first phase current while only the first detection switch is on in the first and second detection switches; and the second current-value pairs of the plural values of the corrective second phase current and the respective plural values of the corrective second phase bus-based current while the plural values of the corrective second phase bus-based current are synchronously detected with the respective plural values of the corrective second phase current while only the second detection switch is on in the first and second detection switches.

3. The current detection apparatus according to claim 2, wherein:
the corrector is configured to:
calculate, based on the obtained first current-value pairs and the second current-value pairs, correction gains for aligning the amplitudes of the respective target first and second phase currents detected by the first current detector; and
multiply the correction gains to the respective target first and second phase currents detected by the first current detector to thereby align the amplitudes of the respective target first and second phase currents detected by the first current detector with each other,
the current detection apparatus further comprising:
a temperature estimator configured to estimate a temperature of each of the first and second detection switches based on the correction gain of the corresponding one of the correction gains.

4. The current detection apparatus according to claim 1, wherein:
the corrector is configured to:
correct, based on the obtained first current-value pairs, the target first phase current detected by the first current detector to thereby zero an offset error of the target first phase current relative to the center of a peak-to-peak variation of the target first phase current; and
correct, based on the obtained second current-value pairs, the target second phase current detected by the first current detector to thereby zero an offset error of the target second phase current relative to the center of a peak-to-peak variation of the target second phase current.

5. The current detection apparatus according to claim 2, wherein:
the first current detector is configured to repeatedly detect at least:
the corrective first phase current while the first detection switch is in an on state for a predetermined first reference period; and
the corrective second phase current while the second detection switch is in an on state for a predetermined second reference period; and
the second current detector is configured to repeatedly detect at least:
the corrective first phase bus-based current for the predetermined first reference period; and
the corrective second phase bus-based current for the predetermined second reference period,
each of the first and second reference periods being a period in which an on resistance of the corresponding one of the first and second detection switches increases from an initial value at a current detection start timing up to 10% of the initial value due to an increase of a temperature of the corresponding one of the first and second detection switches.

6. The current detection apparatus according to claim 5, further comprising:
a timing controller configured to:
determine whether a period, during which the corrective first phase current detected by the first current detector and the corrective first phase bus-based current detected by the second current detector are the same phase current, has exceeded the first reference period;
reduce the first reference period upon determining that the period, during which the corrective first phase current detected by the first current detector and the corrective first phase bus-based current detected by the second current detector are the same phase current, has exceeded the first reference period;
determine whether a period, during which the corrective second phase current detected by the first current detector and the corrective second phase bus-based current detected by the second current detector are the same phase current, has exceeded the second reference period; and
reduce the second reference period upon determining that the period, during which the corrective second phase current detected by the first current detector and the corrective second phase bus-based current detected by the second current detector are the same phase current, has exceeded the second reference period.

7. A control apparatus for controlling a controlled variable of a multiphase rotary electric machine including multiphase windings, the multiphase rotary electric machine being connected to an inverter including plural pairs of series-connected upper-arm switches and lower-arm switches, the upper- and lower-arm switches of each pair being connected to a corresponding phase winding of the multi-phase rotary electric machine, an upper set of the upper-arm switches being connected to a direct-current power supply via a first bus, a lower set of the lower-arm switches being connected to the direct-current power supply via a second bus, the control apparatus comprising:
a rotation detection apparatus according to claim 1; and
a switch controller configured to control on-off switching operations of the upper-arm and lower-arm switches of each pair in accordance with command voltages for the respective multiphase windings, thus adjusting a value of the controlled variable of the multiphase rotary electric machine to a commanded value.

8. The control apparatus according to claim 7, wherein:
the switch controller is configured to temporarily change the on-off switching operations of the upper-arm and lower-arm switches of each pair to thereby expand:
a first detection range of each of the corrective first phase current and the corrective second phase current detected by the first current detector; and
a second detection range of each of the corrective first and second phase bus-based currents detected by the second current detector.

9. The control apparatus according to claim 8, wherein:
the switch controller is configured to temporarily change the on-off switching operations of the upper-arm and lower-arm switches of each pair to thereby shift a phase of each phase current relative to the command voltages for the multiphase windings, thus expanding:

the first detection range of each of the corrective first phase current and the corrective second phase current detected by the first current detector; and the second detection range of each of the corrective first and second phase bus-based currents detected by the second current detector.

10. The control apparatus according to claim 8, wherein: the switch controller is configured to temporarily change the on-off switching operations of the upper-arm and lower-arm switches of each pair to thereby temporarily change an effective voltage vector of the inverter, which is required to adjust the value of the controlled variable of the multiphase rotary electric machine to the commanded value, to another effective voltage vector, thus expanding:

the first detection range of each of the corrective first phase current and the corrective second phase current detected by the first current detector; and the second detection range of each of the corrective first and second phase bus-based currents detected by the second current detector.

11. The control apparatus according to claim 7, wherein: the first current detector is configured to repeatedly detect at least:

the corrective first phase current while a voltage vector of the inverter to be applied to the multiphase windings is set to one of effective voltage vectors; and the corrective second phase current while the voltage vector of the inverter to be applied to the multiphase windings is set to one of the effective voltage vectors;

the second current detector is configured to repeatedly detect at least:

the corrective first phase bus-based current while the voltage vector of the inverter to be applied to the multiphase windings is set to the same effective voltage vector as the corrective first phase current; and the corrective second phase bus-based current while the voltage vector of the inverter to be applied to the multiphase windings is set to the same effective voltage vector as the corrective second phase current; and the corrector is configured to correct the at least target first and second phase currents detected by the first current detector based on the obtained first current-value pairs and the second current-value pairs to thereby align, at a center timing of a zeroth voltage vector period, the amplitudes of the respective target first and second phase currents detected by the first current detector with each other; the zeroth-voltage vector period being a period during which the voltage vector of the inverter is set to the zeroth voltage vector.

12. The control apparatus according to claim 11, wherein: the corrector is configured to obtain:

the first current-value pairs of the plural values of the corrective first phase current and the respective plural values of the corrective first phase bus-based current, the plural values of the corrective first phase bus-based current being synchronously detected with the respective plural values of the corrective first phase current after a first ringing convergence timing for the period during which the voltage vector of the inverter being set to one of the effective voltage vectors; and the second current-value pairs of the plural values of the corrective second phase current and the respective plural values of the corrective second phase bus-based current, the plural values of the corrective second phase bus-based current being synchronously detected with the respective plural values of the corrective second phase current after a second ringing convergence timing for the period during which the voltage vector of the inverter being set to one of the effective voltage vectors, each of the first and second ringing current timings representing that current ringing generated based on switching of the voltage vector of the inverter has sufficiently decreased.

13. The control apparatus according to claim 12, wherein: the switch controller is configured to execute at least one of:

a first two-phase modulation task that:

successively selects the upper-arm switch of one of the multiphases to thereby set the selected upper-arm switch to off for every 120 electrical degrees of the rotary electric machine;

successively select the lower-arm switch of one of the multiphases to thereby set the selected lower-arm switch to on for every 120 electrical degrees of the rotary electric machine; and executes pulse width modulation based on comparison in magnitude between a command signal and a triangular carrier signal for each phase to thereby control on-off switching operations of the upper- and lower-arm switches;

a second two-phase modulation task that:

successively select the upper-arm switch of one of the multiphases to thereby set the selected upper-arm switch to on for every 120 electrical degrees of the rotary electric machine;

successively select the lower-arm switch of one of the multiphases to thereby set the selected lower-arm switch to off for every 120 electrical degrees of the rotary electric machine; and executes pulse width modulation based on comparison in magnitude between the command signal and the triangular carrier signal for each phase to thereby control on-off switching operations of the upper- and lower-arm switches; and the corrector is configured to obtain:

the first current-value pairs of the plural values of the corrective first phase current and the respective plural values of the corrective first phase bus-based current, the plural values of the corrective first phase bus-based current being synchronously detected with the respective plural values of the corrective first phase current at a first timing; and the second current-value pairs of the plural values of the corrective second phase current and the respective plural values of the corrective second phase bus-based current, the plural values of the corrective second phase bus-based current being synchronously detected with the respective plural values of the corrective second phase current at a second timing, each of the first and second timings representing that the triangular carrier signal has reached its positive or negative peak for the period during which the voltage vector of the inverter being set to one of the effective voltage vectors.

14. The control apparatus according to claim 12, wherein:
the switch controller is configured to alternatively execute the first two-phase modulation task and the second two-phase modulation task; and
the corrector is configured to obtain:
- the first current-value pairs of the plural values of the corrective first phase current and the respective plural values of the corrective first phase bus-based current, the plural values of the corrective first phase bus-based current being synchronously detected with the respective plural values of the corrective first phase current for a period during which the voltage vector of the inverter is set to an effective even voltage vector; and
- the second current-value pairs of the plural values of the corrective second phase current and the respective plural values of the corrective second phase bus-based current, the plural values of the corrective second phase bus-based current being synchronously detected with the respective plural values of the corrective second phase current for a period during which the voltage vector of the inverter is set to an effective odd voltage vector.

\* \* \* \* \*